United States Patent
Maruyama et al.

(10) Patent No.: US 6,724,150 B2
(45) Date of Patent: Apr. 20, 2004

(54) DISPLAY DEVICE AND MANUFACTURING METHOD THEREOF

(75) Inventors: Junya Maruyama, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/062,294

(22) Filed: Jan. 31, 2002

(65) Prior Publication Data

US 2002/0149320 A1 Oct. 17, 2002

(30) Foreign Application Priority Data

Feb. 1, 2001 (JP) ........................................ 2001-026176

(51) Int. Cl.$^7$ .............................. G09G 3/10; H01J 1/62
(52) U.S. Cl. ..................................... 315/169.3; 313/506
(58) Field of Search ......................... 315/169.1, 169.3, 315/169.4; 313/504, 506, 512

(56) References Cited

U.S. PATENT DOCUMENTS

| | | | |
|---|---|---|---|
| 5,711,824 A | 1/1998 | Shinohara et al. | 136/259 |
| 5,834,893 A | 11/1998 | Bulovic et al. | 313/506 |
| 5,891,264 A | 4/1999 | Shinohara et al. | 136/261 |
| 5,962,962 A | 10/1999 | Fujita et al. | 313/412 |
| 6,049,167 A | 4/2000 | Onitsuka et al. | 313/512 |
| 6,056,614 A | 5/2000 | Adachi | 445/24 |
| 6,114,805 A * | 9/2000 | Codama et al. | 313/509 |
| 6,117,529 A * | 9/2000 | Leising et al. | 428/209 |
| 6,175,186 B1 | 1/2001 | Matsuura et al. | 313/483 |
| 6,221,543 B1 * | 4/2001 | Guehler et al. | 430/7 |
| 6,284,342 B1 | 9/2001 | Ebisawa et al. | 428/69 |
| 6,380,687 B1 | 4/2002 | Yamazaki | 315/169.3 |
| 6,387,737 B1 * | 5/2002 | Yamazaki et al. | 438/149 |
| 6,433,487 B1 | 8/2002 | Yamazaki | 315/169.3 |
| 6,440,877 B1 * | 8/2002 | Yamazaki et al. | 438/780 |
| 6,476,783 B2 * | 11/2002 | Matthies et al. | 345/82 |
| 6,525,339 B2 | 2/2003 | Motomatsu | 257/40 |
| 2002/0187575 A1 | 12/2002 | Maruyama et al. | 438/33 |

FOREIGN PATENT DOCUMENTS

| | | |
|---|---|---|
| JP | 9-69642 | 3/1997 |
| JP | 10-144927 | 5/1998 |
| JP | 2000-173766 | 6/2000 |

OTHER PUBLICATIONS

Tohma, T. et al., "Development of organic EL display using small molecule material." EL'00 Hamamatsu, pp. 9–13.

U.S patent application Ser. No. 09/671,654, filed Sep. 28, 200, entitled "Organic Electroluminescent Display Device.".

* cited by examiner

Primary Examiner—Don Wong
Assistant Examiner—Minh D A
(74) Attorney, Agent, or Firm—Fish & Richardson P.C.

(57) ABSTRACT

In a display device using an organic light emitting diode (OLED), the occurrence of a dark spot and peeling of a cathode due to moisture are suppressed. An outer edge portion of a sealing substrate (second substrate) (102) is made to have a convex shape and a gap between the sealing substrate and an element substrate are controlled by means of this convex region. Thus, since it is not required that a layer (106) having adhesion for bonding together the sealing substrate and the element substrate has a function for controlling the gap, the thickness of the layer can be minimized. Therefore, the amount of moisture which is transmitted through the layer (having adhesion) made of an organic material and penetrated in a sealed region can be reduced.

48 Claims, 11 Drawing Sheets

DISPLAY DEVICE AND MANUFACTURING METHOD THEREOF

BACKGROUND OF THE INVENTION

1. Field of the Invention

The present invention relates to a display device using an organic light emitting element and a manufacturing method thereof, and more particularly to a display device using an organic light emitting element capable of keeping a stable light emitting property for a long period.

Note that the organic light emitting element in this specification indicates an element in which an organic compound layer is sandwiched between two electrodes to produce light emission. As the organic light emitting element, there is a light emitting element using an organic light emitting diode (OLED). The organic light emitting diode is a phosphor in which an organic compound layer is sandwiched between two electrodes, and a hole is injected from one electrode and an electron is injected from the other electrode so that the hole and the electron are combined in the organic compound layer to thereby produce light emission.

2. Description of the Related Art

Recently, a display device using an organic light emitting element is actively researched. In the case of the display device using the organic light emitting element, greater reduction in its weight and thickness is possible as compared with a conventional CRT and an application to various uses is being progressed. Since it is now possible to connect a mobile telephone, a personal digital assistant (PDA), or the like with the Internet, the amount of information to be displayed has dramatically increased, and the need for color display and high resolution of a display device is increased.

On the other hand, it is important for a display device incorporated in such a personal digital assistant to be reduced in its weight. For example, in the case of the mobile telephone, a product which weighs less than 70 g is currently on the market. For weight reduction, a review of most of parts to be used such as individual electronic parts, a case, and a battery is being conducted. However, in order to realize further weight reduction, it is also necessary to promote weight reduction of a display device.

A display device in which a pixel portion is composed of an organic light emitting element is of a self light emission type and does not require a light source such as a back light used in a liquid crystal display device. Thus, it is being greatly promised as means for realizing reduced weight and thickness.

With the organic light emitting element, blue color light emission is possible and a self light emission display device capable of full color display can be realized. However, in the organic light emitting element, various deterioration phenomena are recognized. which hinder the practical use. Thus, it is considered necessary to solve such a problem as soon as possible.

For example, a dark spot is a point defect of non-light emission, which is observed in a pixel portion, and is recognized as a problem for markedly degrading display quality. It is said that the dark spot is a progress type defect which increases even without operating the element, if moisture is present. It is considered that the dark spot is caused by an oxidation reaction of a cathode made of alkali metal.

Therefore, the display device using the organic light emitting element is constructed such that an element substrate on which a light emitting element is provided and a sealing substrate which is provided so as to oppose the element substrate are bonded together through a seal member having adhesion so that the light emitting element is not exposed to outside air including moisture. The sealing substrate is made of stainless steel or metal such as aluminum, which is easy to process. A dry agent is disposed in a concaved portion of the surface of the sealing substrate.

The seal member is mixed with a filler to control a gap between the element substrate and the sealing substrate. Thus, the seal member has both a function for bonding together the sealing substrate and the element substrate and a function for controlling the gap between the sealing substrate and the element substrate. Therefore. when the gap between the element substrate and the sealing substrate is set to be a general value of 10 $\mu$m to 50 $\mu$m, it is necessary to change the thickness of the seal member in accordance with the size of the gap.

Note that the shortest distance between the light emitting element and a surface of the sealing substrate opposing the light emitting element is called a gap between the sealing substrate and the element substrate, or simply a gap.

Now, the seal member for controlling the gap between the element substrate and the sealing substrate is made of an organic resin material and has higher moisture permeability than an inorganic material such as a glass material. For example, at a temperature of 60° C. and a humidity of 90%, moisture permeability becomes 15 g/m$^2$·24 hr. to 30 g/m$^2$·24 hr. Even when the sealing substrate and the element substrate are sealed with the seal member, the organic light emitting element is deteriorated by a water vapor which is transmitted through the seal member and penetrated in a sealed region. The amount of water vapor to be transmitted through the seal member is determined by the product of an area of the seal member to be exposed to outside air and moisture permeability. Thus, it is desirable that the area of the seal member to be exposed to outside air is small. That is, it is desirable that the thickness of the seal member is minimized.

As the thickness of the seal member is increased, the amount of moisture to be transmitted through the seal member is increased. Even if the dry agent is provided, the light emitting element is deteriorated by the moisture which is not absorbed by the dry agent. That is, an object of the present invention is to reduce the amount of moisture to be transmitted through the seal member.

Also, a method of thinning a glass substrate may be conceived to achieve weight reduction of the personal digital assistant. However, the glass substrate is more likely to break as it becomes thinner and its shock resistance is reduced. In particular, when the sealing substrate made of metal and the element substrate made of glass are bonded together, because of a difference in thermal expansion coefficient, a distortion is caused due to a sudden change in a temperature and a crack is caused in the substrate made of glass. However, this becomes a critical defect in the case where such a substrate is used for the personal digital assistant.

Therefore, an object of the present invention, is to prevent the breaking of the substrate to improve the durability thereof in the case of a construction in which the glass substrate is reduced in thickness to realize a thin display device.

Thus, although the display device composed of the organic light emitting element is very effective for weight reduction of a display device, there remain problems to be solved in order to ensure the reliability of the organic light emitting element.

SUMMARY OF THE INVENTION

The present invention relates to a technique for solving such problems and an object of the present invention is to provide a display device using an organic light emitting element having high reliability and a manufacturing method thereof.

As the substrate made of glass has become thinner, when the element substrate made of glass and the sealing substrate made of metal are bonded together, because of a difference in a thermal expansion coefficient, the possibility that the element substrate made of glass is broken due to a sudden change in a temperature becomes high. In order to prevent this, according to the present invention, a substrate made of glass is used for the element substrate and the sealing substrate to obtain an identical thermal expansion coefficient. Thus, resistance thereof against a sudden change in a temperature is increased, and thus the object of the present invention is attained.

Further, according to the present invention, the surface of the sealing substrate made of glass is processed to have a concaved portion and a dry agent is disposed in the concave portion. Thus, as a conventional case, the dray agent can be provided in a sealed space surrounded by the element substrate, the sealing substrate, and the seal member to capture moisture which is transmitted through an adhesion member and penetrated in the sealed space. Calcium oxide, barium oxide, or the like can be suitably used for the dry agent. The dry agent may be provided on, for example, a driver circuit. Then, since the dry agent is present close to the light emitting element in a sealed region between the element substrate and the sealing substrate, penetration of moisture to the light emitting element can be reduced. Thus, stability of the light emitting element can be improved. For example, a dark spot caused by oxidation of a cathode can be reduced.

Also, according to the present invention, the sealing substrate made of glass is processed so that an outer edge portion of the sealing substrate protrudes in a convex shape. The gap between the element substrate and the sealing substrate is controlled by the convex portion. Then, since a layer having adhesion which is provided between the element substrate and the sealing substrate is required to have only a function for bonding the element substrate and the sealing substrate together, a function for controlling the gap becomes unnecessary. Thus, the thickness of the layer having adhesion can be made as small as possible as its material permits. Therefore, the amount of moisture which is transmitted through the layer having adhesion and penetrated in the sealed region can be reduced, whereby an object of the present invention, that is, reduction of the amount of moisture transmitted through the layer having adhesion, is attained. It is desirable that the thickness of the layer having adhesion (adhesion member) is 10 $\mu$m or less, preferably, 1 $\mu$m or less.

An abrasive machining method (sandblast method) can be used as a method of processing the surface of the sealing substrate. The abrasive machining method is a technique of blasting sands, fine steel billets and the like with compressed air to process the surface of a substrate made of glass.

One example of the construction of the present invention will be described using FIGS. 8A to 8C. FIGS. 8A to 8C are cross sectional views of a display device using an organic light emitting device of the present invention.

FIG. 8A shows an example where, in a display device constructed by bonding together an element substrate and a sealing substrate through a layer having adhesion, the surface of the sealing substrate is processed and a dry agent and a permeable film are provided in a sealed region. A first substrate 101 and a second substrate 102 are made from a translucent substrate, for example, a glass substrate. The first substrate is the element substrate on which an organic light emitting element is provided in a display region 129. The second substrate is the sealing substrate, and the surface thereof is recessed by processing. A dry agent 107 and a permeable film are disposed thereon. Note that, when light emitted from the organic light emitting element is picked up from the sealing substrate side, it is desirable the dry agent and the permeable film be provided outside the display region.

Note that, in the present invention, a region of the second substrate located on the same plane as a portion in which a layer 106 having adhesion is bonded to the second substrate is a first region 103 of the second substrate. Also, a region which is concaved relative to the first region is a second region 104. Further, a region which is concaved relative to the second region is a third region 105. In other wards, when a surface of the second substrate opposing the organic light emitting element is taken as the front surface and it is viewed from the rear surface of the second substrate, the first region is protruded in a convex shape relative to the second region and the third region.

The dry agent 107 is provided in the third region 105. A granular material or a flat sheet material can be also used for the day agent. For filling the dry agent, it is preferable that the third region is recessed by 50 $\mu$m to 150 $\mu$m relative to the second region.

The permeable film having high moisture permeability and having water vapor permeability is composed of an adhesive layer 125, a porous layer 126, and a base member 127. In order to contain the dry agent in the third region, the permeable film is attached with the adhesive layer 125 contacting with a part of the second region. The permeable film composed of the adhesive layer, the porous layer, and the base member, has a thickness of 150 $\mu$m to 300 $\mu$m. Also, it is desirable that the first substrate is located at a distance 10 $\mu$m to 50 $\mu$m or more apart from the surface of the base member constituting the permeable film so that the permeable film is not in contact with the first substrate. Thus, it is desirable that the second region is recessed by 160 $\mu$m to 350 $\mu$m relative to the first region.

Both an ultraviolet light curable resin and a heat curable resin can be used as the layer 106 having adhesion for bonding the element substrate and the sealing substrate together. The amount of moisture entering into the sealed region is determined by the product of an area of the layer having adhesion which is exposed to outside air and moisture permeability. Thus, it is desirable that the thickness of the layer having adhesion is minimized to reduce the area exposed to outside air.

According to the present invention, since the outer edge portion (first region) of the second substrate is protruded in a convex shape, the gap between the first substrate and the second substrate can be determined by the height of the convex portion of the outer edge portion of the second substrate. The layer having adhesion is not required to have a function for controlling the gap and thus may be used only to facilitate bonding of the first substrate and the second substrate. Thus, the layer having adhesion can be made as thin as possible insofar as its material permits.

Next, another example of the present invention is indicated. The present invention described below adopts a construction which takes into consideration not only the reduction of moisture which is transmitted and enters through the layer having adhesion but also the reduction of the amount of moisture left in a dry gas in the sealed region.

FIG. 8B is a cross sectional view of an organic light emitting element. When compared with FIG. 8A, a difference from FIG. 8 is that the gap between the first substrate and the second substrate is made smaller at 10 $\mu$m to 50 $\mu$m in the display region 129. The permeable film has a thickness of 150 $\mu$m to 300 $\mu$m and the gap having such a large thickness is unnecessary in the display region in which the permeable film is not provided. When the gap in the display region which takes up a predominantly large area of a display device is reduced to 3% to 50% as compared with that in FIG. 8A, a volume of a sealed space, that is, a volume of the dry gas is reduced, and the total amount of moisture left in the gas is reduced as a result.

FIG. 8C shows an example in which a flat sheet dry agent 107 is disposed in the third region 105 of the second substrate 102. Calcium oxide or the like is preferably used for the flat sheet dry agent.

In order to prevent mixing of fine powder into the display region which occurs when the dry agent is partially peeled off or otherwise damaged due to a shock applied thereon, adhesives 109 are provided in several locations on the surface of the dry agent and a porous film 108 having a thickness of 10 $\mu$m to 30 $\mu$m is attached to the dry agent through the adhesives 109. Thus, when the dry agent is covered with the porous film, fine powder produced due to a mechanical shock can be contained inside the porous film. It is preferable that the porous film are hollowed in a circular shape in two or more locations to expose the dry agent, an adhesive 110 is applied to the thus exposed portions. whereby the dry agent and the second substrate are bonded to each other. The thickness of the adhesive can be set to be 1 $\mu$m to 5 $\mu$m by controlling the amount of the adhesive to be applied onto the surface of the dry agent. In the case of FIG. 8C, it is desirable that a thickness of the porous film, a thickness of the dry agent and a thickness of the adhesive are adjusted so that the dry agent and the porous film can be received in the third region recessed by 50 $\mu$m to 150 $\mu$m relative to the second region.

In the cases of FIGS. 8A and 8B, in order not to crush the permeable film due to weight of the dry agent, it is required that the base member 127 having a thickness of 100 $\mu$m to 150 $\mu$m is provided in contact with the porous film 126 having a thickness of about 10 $\mu$m to 70 $\mu$m. Thus, the thickness of the base member and the thickness of the porous film needs to be increased to improve a mechanical strength of the permeable film. Further, since the adhesive layer 125 having a thickness of 40 $\mu$m to 80 $\mu$m is required for adhering the film to the substrate, the overall thickness of the permeable film becomes as large as 150 $\mu$m to 300 $\mu$m. Thus, the amount of moisture left in the gas in the sealed space is increased in correspondence with a volume occupied by the permeable film.

However, in the case of FIG. 8C, the film is only required to cover the dry agent and needs not to have high mechanical strength. Thus, even when a thin porous film having a thickness of 10 $\mu$m to 30 $\mu$m is used, there is no problem for practical use. Also, a volume of the sealed space can be reduced due to the reduced thickness of the film. To cover the dry agent, the porous films are provided on an upper surface (surface opposing the second substrate) of the dry agent and on a lower surface (surface opposing the first substrate) thereof. Thus, when the porous film having a thickness of 10 $\mu$m to 30 $\mu$m is used, the thickness of the porous film within the gap becomes twice as large, that is, 20 $\mu$m to 60 $\mu$m. Even so, the thickness of the porous film within the gap is made smaller than the thickness of permeable film. If the amount of dry agent is the same, a volume of the sealed region can be reduced with the construction shown in FIG. 8C, and thus the amount of moisture left in the gas becomes small. This leads to the suppression of oxidation reaction of the cathode due to moisture and the useful life of the display device can be increased.

Note that, in the case of FIG. 8C, it is preferable that the second region 104 is recessed by 10 $\mu$m to 50 $\mu$m relative to the first region so that the gap between the first substrate and the second substrate in the display region is set to be 10 $\mu$m to 50 $\mu$m.

Also, in the present invention, since the sealing substrate and the element substrate are translucent, light emitted from the organic light emitting element provided on the element substrate may be emitted toward either the sealing substrate side or the element substrate side. This can be freely designed in consideration of a size of the light emission area of the organic light emitting element and the like.

The present invention based on the above descriptions is as follows.

According to a first aspect of the present invention described in this specification, there is provided a display device comprising a first substrate on which an organic light emitting element is provided and a second substrate which is translucent, the first substrate and the second substrate being bonded together through a layer having adhesion, characterized in that a surface of the second substrate opposing the first substrate includes a first region and a second region, the first region is adhered with the layer having adhesion, and the second region is located inside the first region and is concaved relative to the first region.

In the first aspect of the present invention described in this specification, a portion of the sealing substrate to which the layer having adhesion is provided is made convex to the element substrate. Thus, a gap between the first substrate and the second substrate can be determined by a convex portion of the second substrate and the layer having adhesion can be used only for the purpose of bonding the first substrate and the second substrate together.

According to a second aspect of the present invention described in this specification, there is provided a display device comprising a first substrate on which an organic tight emitting element is provided and a second substrate which is translucent, the first substrate and the second substrate being bonded together through a layer having adhesion, characterized in that: a surface of the second substrate opposing the first substrate includes a first region, a second region, and a third region; the first region is adhered with the layer having adhesion; the second region is located inside the first region and concaved relative to the first region; the third region is located inside the second region and concaved relative to the second region; and a dry agent is provided in the third region.

In the second aspect of the present invention described in this specification, since a portion of the second substrate to which the layer having adhesion is adhered is convex, the sealing substrate has a function for controlling the gap, as in the first aspect of the present invention described in this specification. Further, the dry agent is provided in a concaved portion of the surface of the second substrate to capture moisture penetrated in the sealed region. Thus, the stability of the organic light emitting element is ensured for driving over a long period of time.

According to a third aspect of the present invention described in this specification, there is provided a display device characterized in that, in the second aspect of the present invention described in this specification, a permeable film is adhered to a part of the second region so that the dry agent is contained in the third region.

As in the case of the third aspect of the present invention described in this specification, a permeable film may be used as means for providing the dry agent in the third region.

According to a fourth aspect of the present invention described in this specification, there is provided a display device comprising a first substrate on which an organic light emitting element is provided, a layer having adhesion for enclosing with a gap an area surrounding a region in which the organic light emitting element is provided on the first substrate, and a second substrate which is translucent, the first substrate and the second substrate being bonded together through the layer having adhesion, characterized in that: a surface of the second substrate opposing the first substrate includes a first region, a second region, and a third region; the first region is adhered with the layer having adhesion; the second region is surrounded by the first region and concaved relative to the first region; the third region is located between the layer having adhesion and an upper portion of the region in which the organic light emitting element is provided and is concaved relative to the second region; and a dry agent is located in the third region.

In the fourth aspect of the present invention, a difference from the second aspect of the present invention described in this specification is that the dry agent is provided only in a region outside the display region.

According to a fifth aspect of the present invention described in this specification, there is provided a display device characterized in that, in the fourth aspect of the present invention described in this specification, a permeable film is provided between the layer having adhesion and the upper portion of the region in which the organic light emitting element is provided, and the permeable film is adhered to a part of the second region to thereby contain the dry agent in the third region.

As in the case of the fifth aspect of the present invention described in this specification, a permeable film may be used as means for providing the dry agent in the third region. The permeable film is preferably disposed outside the display region.

According to a sixth aspect of the present invention described in this specification, there is provided a display device characterized in that, in the third or the fifth aspect, the permeable film adhered to the second region is fit between a plane which is contact with the first region and a surface on which the permeable film is adhered to the second region. In other words, it is required that the permeable film is at least not in contact with the first substrate.

According to a seven aspect of the present invention described in this specification, there is provided a display device characterized in that, in the second aspect of the present invention described in this specification or in the fourth aspect of the present invention described in this specification, a difference in height between a bottom portion of the second region which is concaved relative to the first region and the first region is 10 $\mu$m to 50 $\mu$m. One example of the seven aspect of the present invention described in this specification has been described already using FIG. 8C.

According to an eighth aspect of the present invention described in this specification, there is provided a display device characterized in that, in the third aspect of the present invention described in this specification or in the fifth aspect of the present invention described in this specification, a difference in height between a bottom portion of the second region which is concaved relative to the first region and the first region is 160 $\mu$m to 350 $\mu$m. One example of the eight aspect of the present invention has been described already using FIGS. 8A and 8B.

According to a ninth aspect of the present invention described in this specification. there is provided a display device characterized in that, in any one of the first through eighth aspects of the present invention described in this specification, a difference in height between a bottom portion of the third region which is concaved relative to the second region and the second region is 50 $\mu$m to 150 $\mu$m. One example of the ninth aspect of the present invention described in this specification has been described already using FIGS. 8A to 8C.

According to a tenth aspect of the present invention described in this specification, there is provided a display device characterized in that, in any one of the first through ninth aspects of the present invention described in this specification, the first substrate is a glass substrate.

According to an eleventh aspect of the present invention described in this specification, there is provided a display device characterized in that, in any one of the first through ninth aspects of the present invention described in this specification, each of the first substrate and the second substrate is a glass substrate.

The shock resistance of the substrate decreases as it becomes thinner. Thus, when substrates are made from different materials, a crack is caused in a substrate made of glass due to a sudden change in a temperature. This is a phenomenon resulting from a difference in thermal expansion coefficient. However, when the first substrate and the second substrate are made of the same material as in the case of the eighth aspect, occurrence of a crack due to a thermal shock can be prevented.

According to a twelfth aspect of the present invention described in this specification, there is provided a display device characterized in that, in any one of the first through eleventh aspects of the present invention described in this specification, a thickness of the layer having adhesion is 10 $\mu$m or less.

According to the present invention, since it is unnecessary to keep the gap by the layer having adhesion, the thickness of the layer having adhesion can be minimized. It is particularly desirable that the thickness of the layer having adhesion be set to 10 $\mu$m or less in order to suppress the penetration of moisture in the sealed region.

According to a thirteenth aspect of the present invention described in this specification, there is provided a method of manufacturing a display device in which a first substrate and a second substrate which are translucent are bonded together through a layer having adhesion and an organic light emitting element is provided in the first substrate, characterized by comprising: a first step of setting a region of the second substrate to which the layer having adhesion is adhered as a first region and providing a first mask in at least the first region; a second step of digging the second substrate by an abrasive machining method to form a second region which is concaved relative to the first region; a third step of removing the first mask; a fourth step of providing a second mask in a region of the second substrate in which al least the first mask was provided and a region located above a region in which the organic light emitting element is provided and digging the second substrate by an abrasive machining method to thereby form a third region which is concaved relative to the second region; and a fifth step of providing a dry agent in the third region.

According to a fourteenth aspect of the present invention described in this specification, there is provided a method of manufacturing a display device characterized by further including, in the thirteenth aspect of the present invention described in this specification, a sixth step of providing a permeable film in the second region after the fifth step.

As a method of providing the dry agent in the third region, there are a method of adhering the dry agent to the second substrate and a method of adhering an adhesive layer of the permeable film to the second region to thereby contain the dry agent in the third region. The fourteenth aspect of the present invention described in this specification is a method used for the latter method.

According to a fifteenth aspect of the present invention described in this specification, there is provided a method of manufacturing a display device characterized in that, in the fourteenth aspect of the present invention described in this specification, a digging depth of the second substrate in the second step is larger than a thickness of the permeable film.

According to a sixteenth aspect of the present invention described in this specification, there is provided a method of manufacturing a display device characterized in that, in the thirteenth aspect of the present invention described in this specification, the digging depth in the second step is 10 $\mu$m to 50 $\mu$m. According to the sixteenth aspect of the present invention described in this specification, by processing the surface of the second substrate in the structure shown in FIG. 8C, for example, the second region can be recessed by 10 $\mu$m to 50 $\mu$m relative to the first region.

According to a seventeenth aspect of the present invention described in this specification, there is provided a method of manufacturing a display device characterized in that, in the fourteenth or the fifteenth aspect of the present invention described in this specification, the digging depth in the second step is 160 $\mu$m to 350 $\mu$m. According to the seventeenth aspect of the present invention described in this specification, in the structure shown in FIG. 8A or 8B, the second region 104 can be recessed by 160 $\mu$m to 350 $\mu$m relative to the first region 103.

According to an eighteenth aspect of the present invention described in this specification, there is provided a method of manufacturing a display device characterized in that, in any one of the thirteenth through seventeenth aspects of the present invention described in this specification, the digging depth in the third step is 50 $\mu$m to 150 $\mu$m. According to the eighteenth aspect of the present invention described in this specification, as shown in FIGS. 8A to 8C, the third region 105 in which the dry agent is provided can be recessed by 50 $\mu$m to 150 $\mu$m relative to the first region 104.

According to a nineteenth aspect of the present invention described in this specification, there is provided a method of manufacturing a display device characterized by further including, after the fifth step in the thirteenth through sixteenth aspect of the present invention described in this specification, a sixth step of bonding the first substrate and the second substrate together through the layer having adhesion and a seventh step of cutting the first substrate and the second substrate by a gas laser.

According to a twentieth aspect of the present invention described in this specification, there is provided a method of manufacturing a display device characterized by further including, after the sixth step in any one of the fourteenth through sixteenth aspects of the present invention described in this specification, a seventh step of bonding the first substrate and the second substrate together through the layer having adhesion and an eighth step of cutting the first substrate and the second substrate by a gas laser.

According to a twenty-first aspect of the present invention described in this specification, there is provided a method of manufacturing a display device characterized in that, in the nineteenth or twentieth aspect of the present invention described in this specification, the gas laser is a $CO_2$ laser.

In accordance with another aspect of the present invention, a light emitting device of the present invention includes a first substrate and a second substrate opposed to each other and at least a light emitting layer interposed therebetween where the light is emitted out from the light emitting device through the second substrate and an inner surface of the second substrate is provided with minute unevennesses in order that outside light is prevented from reflecting at the interface between the second substrate and a sealed space and in an interface between the second substrate and air. Further, the heights of the minute unevennesses are set to be 0.1 $\mu$m to 3 $\mu$m, preferably, 0.1 $\mu$m to 0.5 $\mu$m. In order to prevent diffraction, it is preferable that the unevennesses having different curvatures are provided to improve scattering property. Taking the spacing (pitch) between the convex portions as X, it is preferable to set X=0.05 to 1 $\mu$m (more preferably between 0.3 and 0.8 $\mu$m). In other words, by setting the pitch of the convex portions to be nearly equal to the wavelength of visible light, diffuse reflection (irregular reflection) of the reflected light can be made to occur effectively.

DETAILED DESCRIPTION OF THE PREFERRED EMBODIMENTS

Embodiment Mode 1

Figure 1:
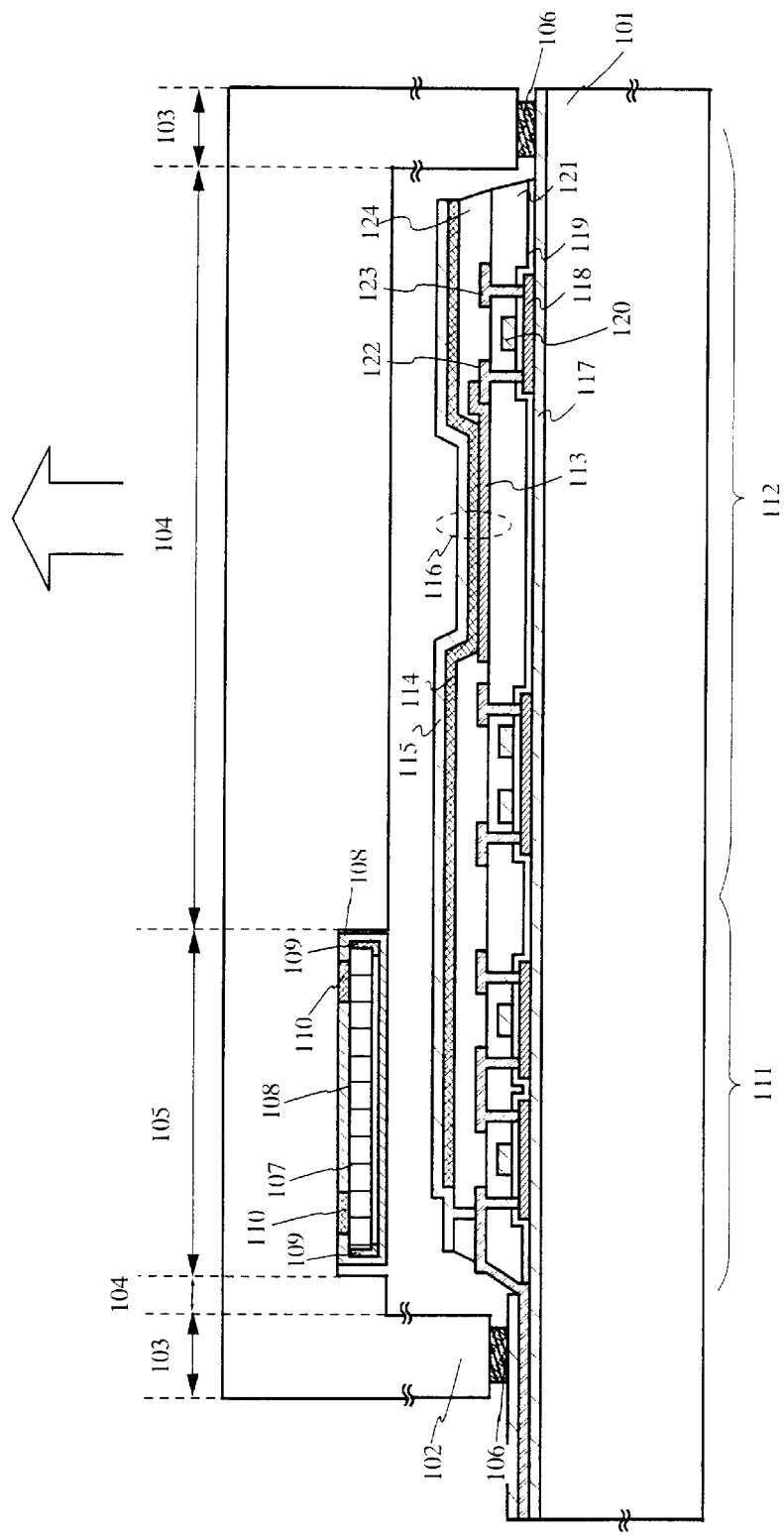
FIG. 1 is a cross sectional view of a display device using an organic light emitting element according to Embodiment Mode 1.

An embodiment mode of the present invention will be described using FIG. 1. FIG. 1 is a cross sectional view of an active matrix display device using an organic light emitting element.

A driver circuit portion 111 and a pixel portion 112 which are composed of TFTs are formed on a first substrate (element substrate) 101.

Substrates made of glass such as barium borosilicate glass, aluminoborosilicate glass, or quartz glass are used as the first substrate and the second substrate (sealing substrate) 102.

The surface of the second substrate is processed by an abrasive machining method and selectively shaved. By this processing, the surface of the second substrate has a first region 103, a second region 104, and a third region 105. The first region is a surface to which a layer having adhesion is adhered. When viewed from a rear surface of the second substrate, the first region is protruded in a convex shape relative to the second region and the third region.

An epoxy system adhesive is used for a layer 106 having adhesion. It is desirable that the thickness of the layer having adhesion be as small as possible. LIXSON BOND LX-0001 sold by Chisso Corporation can be also used as the adhesive. LX-0001 is a two-part epoxy resin. After LX-0001 is applied onto the first substrate, while the first substrate and the second substrate are pressed, it is cured at 100° C. for 2 hours. A thickness of the adhesive after the curing becomes 0.5 $\mu$m to 2.0 $\mu$m. A dry agent 107 is provided in a concave portion of the third region. Calcium oxide is used for the dry agent. A known material can be used for the dry agent. In this embodiment mode a planer dry agent is used. A thickness of the dry agent is desirably 10 $\mu$m to 80 $\mu$m. In this embodiment mode, the thickness of the dry agent is set to be 80 $\mu$m. The dry agent absorbs moisture entering into an organic light emitting element after the first substrate and the second substrate are sealed through the layer having adhesion. Since the dry agent is provided adjacent to a region in which the light emitting element is provided, a concentration of moisture in a sealed region can be reduced and a life of the display device can be extended.

In order to avoid moving of fine powder of the dry agent into the pixel portion and the drive circuit portion, a porous film 108 is provided so as to cover the dry agent. An adhesive 109 is applied in dots onto the surface of the dry agent and the porous film is adhered to the dry agent. Also, the porous film is cut out in a circle and an adhesive 110 is applied to the thus exposed portion of the dry agent to thereby bond the dry agent 107 and the second substrate 102 with each other.

It is desirable that the porous film be as thin as possible. In this embodiment mode, the thickness of the porous film is set to be 10 $\mu$m. Also, the thickness of the adhesive can be set to be 5 $\mu$m or less, preferably, 1 $\mu$m or less by controlling the amount thereof to be applied to the dry agent. In this embodiment mode, the thickness of the adhesive is set to be 5.0 $\mu$m. Since the thickness of the dry agent is 80 $\mu$m, when the third region is recessed by about 110 $\mu$m relative to the second region, the dry agent 107, the adhesives 109 and 110, and the porous film 108 can be received in the third region.

In the pixel portion, the gap between the first substrate and the second substrate is preferably set to be 10 $\mu$m to 50 $\mu$m. In order to set the gap in the pixel portion to be within this range, the second region 104 is preferably recessed by about 10 $\mu$m to 50 $\mu$m relative to the first region 103. In this embodiment mode, in order to set the gap between the first substrate and the second substrate to be 50 $\mu$m in the pixel portion, the second region is recessed by 48 $\mu$m relative to the first region. This is a value which is obtained by considering the thickness (2 $\mu$m) of the layer having adhesion in this embodiment mode. Note that, with respect to the gap between the organic light emitting element and the sealing substrate in the pixel portion, a difference of several $\mu$m is actually produced due to the thickness of an interlayer insulating film 121. However, for convenience of description, it is assumed that the thickness of the interlayer insulating film can be neglected.

Since there is a gap of about 50 $\mu$m between the porous film 108 and the driver circuit portion, the porous film 108 is not brought into contact with the driver circuit portion and thus TFTs in the driver circuit are not damaged.

An organic light emitting element 116 has a structure in which a cathode 113, an organic compound layer 114, and an anode 115 are laminated in order and light emitted from the light emitting element is outputted to the second substrate 102 side. With such a structure, the cathode made of a conductive film having a reflective property can be overlaid over an electrode of a TFT and a wiring, a light emitting area is increased, and display having high luminance and good visibility can be obtained.

A material including magnesium (Mg), lithium (Li), or calcium (Ca) which has a small work function is used for the cathode 113. Preferably, an electrode made of MgAg (material in which Mg and Ag are mixed at Mg:Ag=10:1) is used. In addition, it is also possible to use an MgAgAl electrode, an LiAl electrode, and an LiFAl electrode. The cathode is made of a material such as MgAg or LiF. The thickness of the cathode is preferably 100 nm to 200 nm.

The anode 115 is made of an ITO (indium tin oxide) film that is a translucent conductive film. The thickness of the anode is preferably 100 nm to 200 nm.

The organic compound layer 114 is obtained by laminating an electron transport layer, a light emitting layer, a hole transport layer, and a hole injection layer in order. However, the organic compound layer may alternatively be obtained by laminating an electron transport layer, a light emitting layer, and a hole transport layer or by laminating an electron injection layer, an electron transport layer, a light emitting layer, a hole transport layer, and a hole injection layer, in the stated order. In the present invention, any known structure may be used.

With respect to specific light emitting layers, preferably, cyanopolyphenylene is used for a light emitting layer for emitting light having a red color, polyphenylenevinylene is used for a light emitting layer for emitting light having a green color, and polyphenylenevinylene or polyalkylphenylene is used for a light emitting layer for emitting light having a blue color. The thickness of the light emitting layers may be set to 30 nm to 150 nm.

The above example is one example of materials which can be used for a light emitting layer, and the materials are not limited to these. Materials for forming a light emitting layer, a hole transport layer, a hole injection layer, an electron transport layer, and an electron injection layer can be freely selected from possible combinations.

TFTs which compose the driver circuit portion and the pixel portion are provided on a base film 117 having an insulating property. A TFT is composed of a semiconductor film 118, a gate insulating film 119, a gate electrode 120, an interlayer insulating film 121, a drain electrode 122, and a source electrode 123. Preferably, the thickness of the semiconductor film is set to be 10 nm to 150 nm, the thickness of the gate insulating film is set to be 50 nm to 200 nm, the thickness of the gate electrode is set to be 50 nm to 80 nm, the thickness of the interlayer insulating film is set to be 1 µm to 6 µm, and the thicknesses of the drain electrode and the source electrode are set to be 200 nm to 800 nm.

In order to prevent a disconnection in the organic compound layer 114 and a short circuit between the anode 115 and the cathode 113 due to a break of the organic Light emitting element, a bank 124 made of an organic resin such as acrylic or polyimide, preferably a photosensitive organic resin, is provided so as to partially overlap with end portions of the cathode. When the organic compound layer is formed along gradual tapers of the bank 124, the disconnection in the organic compound layer in end portions of the cathode and therefore the short circuit between the anode and the cathode resulting from the disconnection in the organic compound layer is prevented. The film thickness of the bank is set to be 1 µm to 3 µm.

In this embodiment mode, in order to set the gap between the first substrate and the second substrate in the pixel portion to be 50 µm, the necessary thickness of the layer having adhesion is 2 µm. Thus, an area in side surfaces of the display device in which the organic resin material is exposed to outside air is reduced so that the amount of moisture greatly transmitted through the organic resin material (layer having adhesion) can be greatly reduced as compared with a conventional art.

That is, the amount of moisture which is transmitted through the layer having adhesion and penetrated in the sealed space can be reduced. Thus, the object of the present invention is attained and the life of the organic light emitting element can be improved.

FIGS. 7A to 7D are cross sectional views for explaining steps for processing a substrate by an abrasive machining method. There is MB-1 produced by Sintobrator, Ltd. as one example of an apparatus used for the above processing.

Figure 7A:
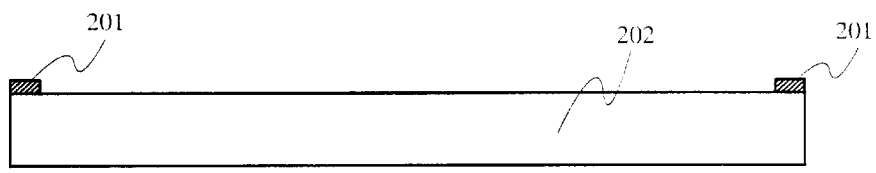
FIGS. 7A to 7D are cross sectional views indicating a method of manufacturing a sealing substrate in Embodiment Mode 1.

FIG. 7A is a cross sectional view showing a state in which first masks 201 are disposed in selective positions on a substrate 202 made of glass before processing. The first mask is disposed in a region in which the layer having adhesion is provided. First, a film is adhered to the surface of the substrate, exposed to ultraviolet light, then developed with an alkalescent solution, and dried to thereby form the first mask. An ultraviolet curable type urethane resin is preferably used for the film adhered to the surface of the substrate. This is because of its high shock resistance in the abrasive machining process. The thickness of first mask is preferably 0.05 mm to 0.5 mm.

Figure 7B:
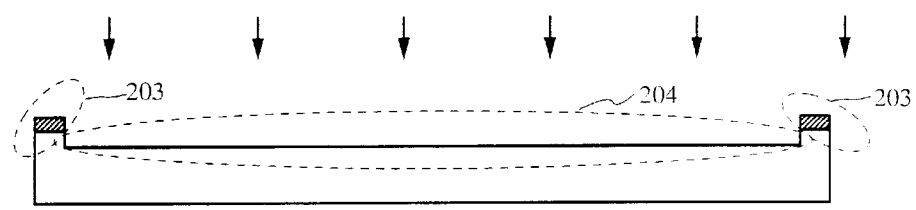

FIG. 7B is a cross sectional view indicating a first processing step of performing abrasive machining by jetting fine powder onto the substrate. Fine powder having an average particle size of 3 µm to 40 µm is jetted onto the surface of the substrate to selectively remove a portion in which the first mask is not present. After the processing, the substrate is washed to remove processing scraps on the substrate. Thus, a first region 203 and a second region 204 which is recessed relative to the first region can be formed on the surface of the substrate.

Figure 7C:
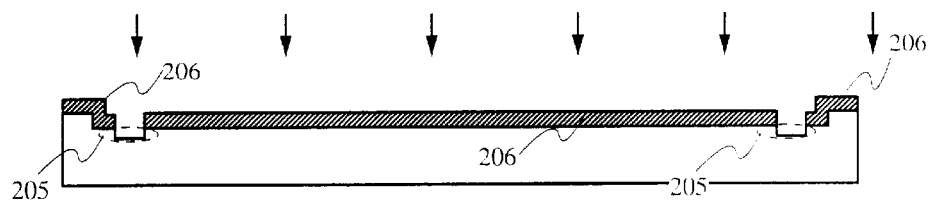

FIG. 7C is a cross sectional view indicating a second processing step of providing second masks 206 on the substrate and performing abrasive machining. Fine powder is jetted to dig the surface of the substrate. Thus, a third region 205 which is recessed relative to the second region can be formed on the surface of the substrate.

Figure 7D:
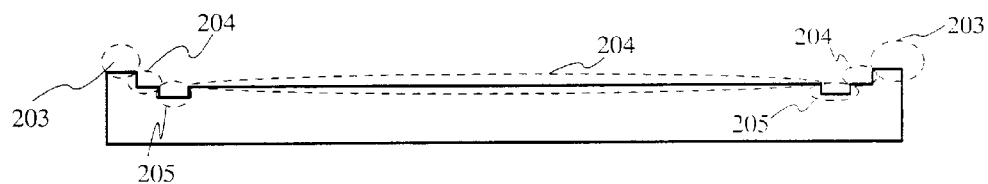
Figure 8A:
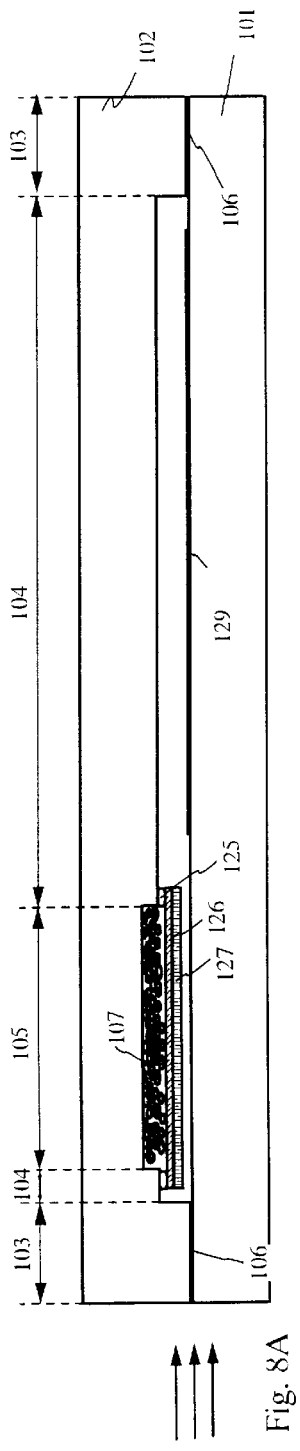
FIGS. 8A to 8C are cross sectional views of a display device using an organic light emitting element according to the present invention.
Figure 8B:
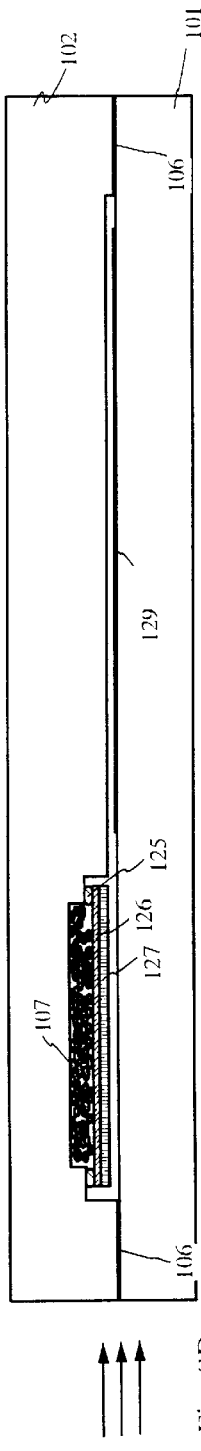
Figure 8C:
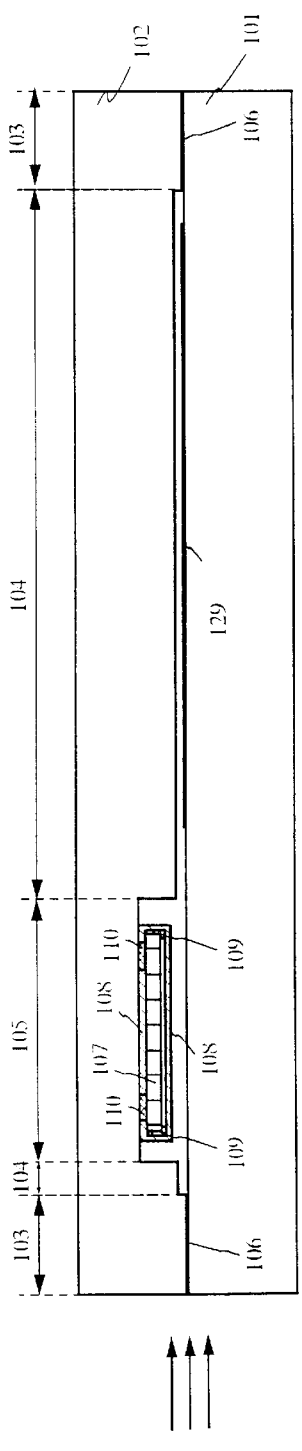

FIG. 7D is a cross sectional view of the substrate after the second masks are removed. In this embodiment mode, a depth of digging in the first processing step is 48 µm and a depth of digging in the second processing step is 110 µm. When the thickness of the substrate before the processing is 0.6 mm, the thickness of the substrate in the first region 203 becomes 0.6 mm, the thickness of the substrate in the second region 204 becomes 0.552 mm, and the thickness of the substrate in the third region 205 becomes 0.442 mm. In this embodiment mode, the second region has the largest occupying area. The thickness of the substrate in the second region is 0.552 mm, which is a preferable value for weight and thickness reduction of a display device. Of course, the thickness of the second substrate before the processing may be set to be 0.6 mm or less so that the weight of the display device can be further reduced.

Next, the amount of moisture which can be captured is estimated as follows based on the amount of dry agent provided in the third region. Moisture permeability of the organic resin is 15 $g/m^2$ day to 30 $g/m^2$ day in an environment of 60° C. and a humidity of 90%. In this embodiment mode, the moisture permeability of the adhesive is assumed to be 20 $g/m^2$ per day to estimate the amount of moisture which is transmitted through the adhesive and penetrated in the sealed region.

It is assumed that the display device of this embodiment mode has a rectangular shape with a side of 7 cm and the height of the layer having adhesion (adhesive) is 2 µm. An area of the layer having adhesion exposed to air is $0.56 \times 10^{-6}$ $m^2$. When an exposed area is multiplied by the moisture permeability, the amount of moisture transmitted per day is obtained as $114 \times 10^{-7}$ g/day.

The total amount of moisture transmitted through the layer having adhesion in 10 years is $41.6 \times 10^{-3}$ g. When calcium oxide is used for the dry agent, the amount of calcium oxide required for absorbing 1 g of moisture is 3 g and the amount of calcium oxide for completely absorbing the amount of moisture penetrating in 10 yours is 125 mg. Since the calcium oxide is existent at 3.0 $g/cm^3$, when a volume of the calcium oxide to be filled is 41.7 $mm^3$, the total amount of moisture which enters through the layer having adhesion in 10 years can be completed absorbed.

The display region has a rectangular shape with a side of 60 mm and widths of the driver circuit portion are 60 mm in a side parallel to the display region and 3 mm in a side perpendicular to the display region. When three driver circuit portions (two gate drivers and one source driver) are provided, an area occupied by the driver circuit portions is 54 $mm^2$. In other words, when a gap is provided in a position of the sealing substrate corresponding to a region above the driver circuit portions and calcium oxide is filled therein, if the thickness of the dry agent made of calcium oxide is 77 µm, the volume of the dry agent becomes 41.7 $mm^3$. Thus, the amount of dry agent for completely absorbing the amount of moisture entering through the layer having adhesion in 10 years can be filled. In this embodiment mode, the thickness of the dry agent is 80 µm. Thus, it can be calculated that there exists the amount of dry agent sufficient for a long term usage (use for al least 10 yours).

The amount of moisture transmitted through a seal member varies according to a temperature or humidity. Thus, the amount of dry agent used in the present invention may be determined as appropriate according to a use environment of the display device.

Embodiment Mode 2

Figure 2:
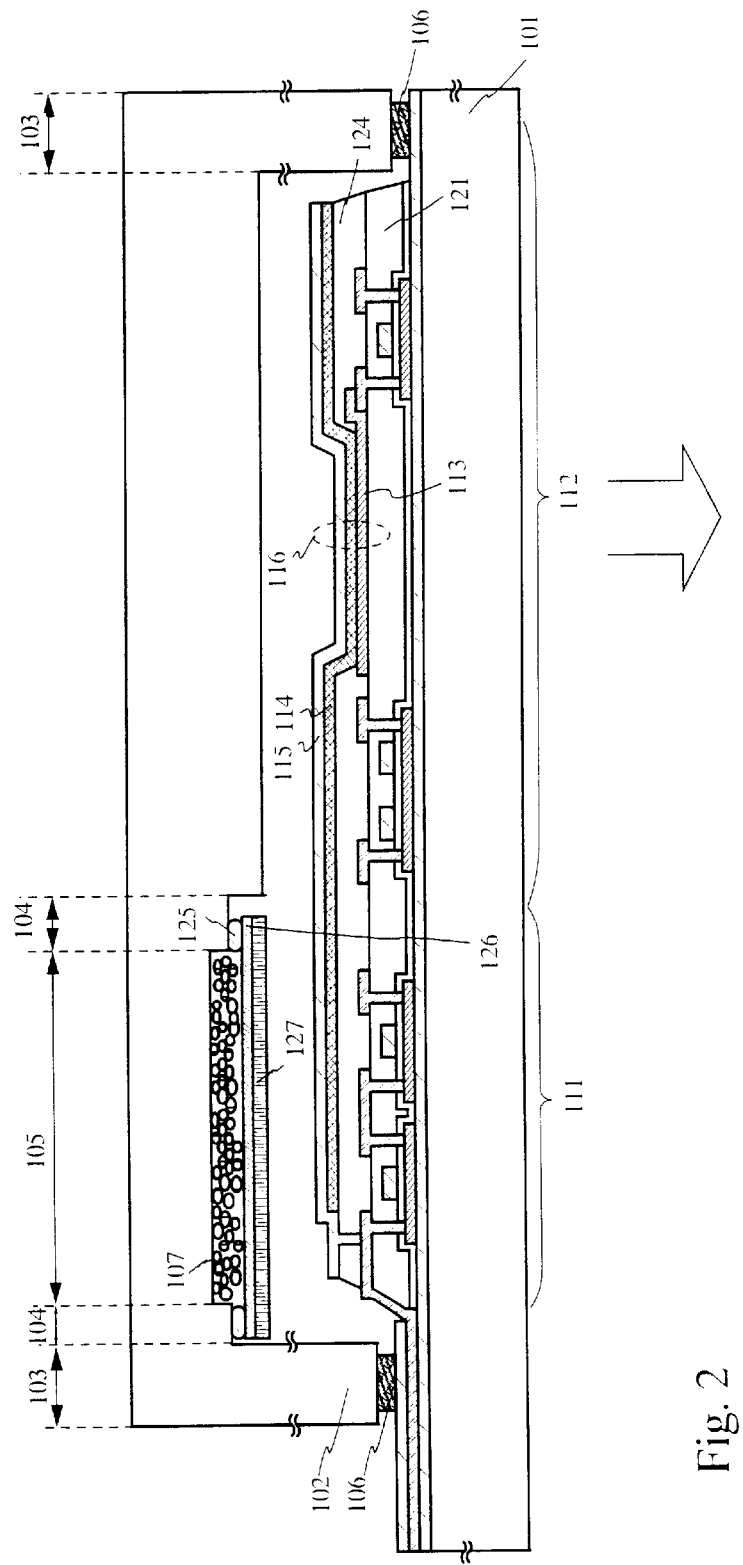
FIG. 2 is a cross sectional view of a display device using an organic light emitting element according to Embodiment Mode 2.

In this embodiment mode, an example where a dry agent and a permeable film are provided over a driver circuit portion is indicated. In this embodiment mode, points which are different from Embodiment Mode 1 will be described in detail. This embodiment mode will be described using a cross sectional view of FIG. 2. FIG. 2 is a cross sectional view of an active matrix display device using an active matrix organic light emitting element. Shown in the drawing is a driver-circuit-integrated structure in which a pixel portion 112 and a driver circuit portion 111 are formed on the same substrate.

Substrates made of glass can be used as a first substrate 101 and a second substrate 102.

In this embodiment mode, a granular material is used for a dry agent 107. When the dry agent is granular, a surface area thereof is increased and thus it is easier to absorb moisture. It is desirable that a particle size of the dry agent is set to be 10 $\mu$m to 80 $\mu$m. In this embodiment mode, the dry agent having the particle size of 30 $\mu$m is used. Also, in this embodiment mode, it is assumed that a third region 105 in which the dry agent is provided is recessed by 100 $\mu$m relative to a second region 104. Calcium oxide is used for the dry agent.

In order to contain the dry agent in the third region 105, a permeable film which is composed of an adhesion layer 125, a porous layer 126, and a base member 127 is used. Polyester can be used for the base member and a polyfluoroethylene system fiber can be used for the porous layer. NTF1121 produced by Nitto Denko Corporation which has high moisture permeability (moisture permeability of 6800 g/m$^2$·24 hours in measurement based on JIS K 7129 method A) is preferably used for the porous film. Also, the thickness of the permeable film is preferably 150 $\mu$m to 300 $\mu$m. In this embodiment mode, the thickness of the permeable film is set to be 150 $\mu$m.

Also, a gap of about 50 $\mu$m is provided between the permeable film and the driver circuit portion so that TFTs in the driver circuit portion are not in contact with the permeable film. Thus, considering the thickness of the permeable film (150 $\mu$m) and an interval between the permeable film and the driver circuit portion, the second region 104 in which the permeable film is provided is recessed by 200 $\mu$m relative to the first region 103.

It is desirable that the thickness of a layer 106 having adhesion for bonding the first substrate and the second substrate be as small as possible. In this embodiment mode, the thickness of the layer having adhesion is set to be 1.5 $\mu$m.

When a volume of the seated space defined by the first substrate, the second substrate, and the layer having adhesion is to be decreased to reduce the total amount of moisture left in a dry gas in the sealed space, a distance between the first substrate and the second substrate in the pixel portion may be set to be shorter than a distance between the first substrate and the second substrate in the driver circuit portion. Since there is no need to particularly provide the permeable film in the pixel portion, a distance between the substrates in the pixel portion can be arbitrarily determined in consideration of the visibility of a display region and the like. In this embodiment mode, the distance between the first substrate and the second substrate in the pixel portion is set to be 50 $\mu$m.

In this embodiment mode, an anode 113, an organic compound laser 114, and a cathode 115 are laminated in this order to form an organic light emitting element 116. A transparent electrode made of ITO is used as the anode. Alkali earth metal such as MgAg or alkali metal such as AlLi is used as metal having a small work function for the cathode. Thus, a structure in which light emitted from the organic light emitting element is outputted from the first substrate 101 side is obtained. A hole transport layer, a light emitting layer, and an electron transport layer are laminated in this order to obtain the organic compound layer. Three kinds of light emitting layers corresponding to RGB are preferably formed to enable color display.

When the thickness of the second substrate is set to be 0.7 mm, the thickness of the substrate in the first region becomes 0.7 mm, the thickness of the substrate in the second region becomes 0.5 mm, and the thickness of the substrate in the third region becomes 0.4 mm. In the second substrate, the second region has the largest occupying area. Thus, it may be considered that the thickness or the weight of the second substrate is substantially determined by the thickness of the glass substrate in the second region. In other words, the thickness of the glass substrate in the second region occupying the largest area of the substrate is 0.5 mm, which is a value suitable for reducing thickness and weight of the display device.

Also, with the structure according to this embodiment mode, the granular dry agent having a large surface area and high moisture absorption can be provided in the sealed region using the permeable film. Also, in this embodiment mode, the dry agent is provided on the driver circuit portion. However, the dry agent can also be provided above the pixel portion. Considering a direction of light emitted from the organic light emitting element, even if the dry agent is provided on the pixel portion, it will not affect the display at all.

Embodiment Mode 3

Figure 3:
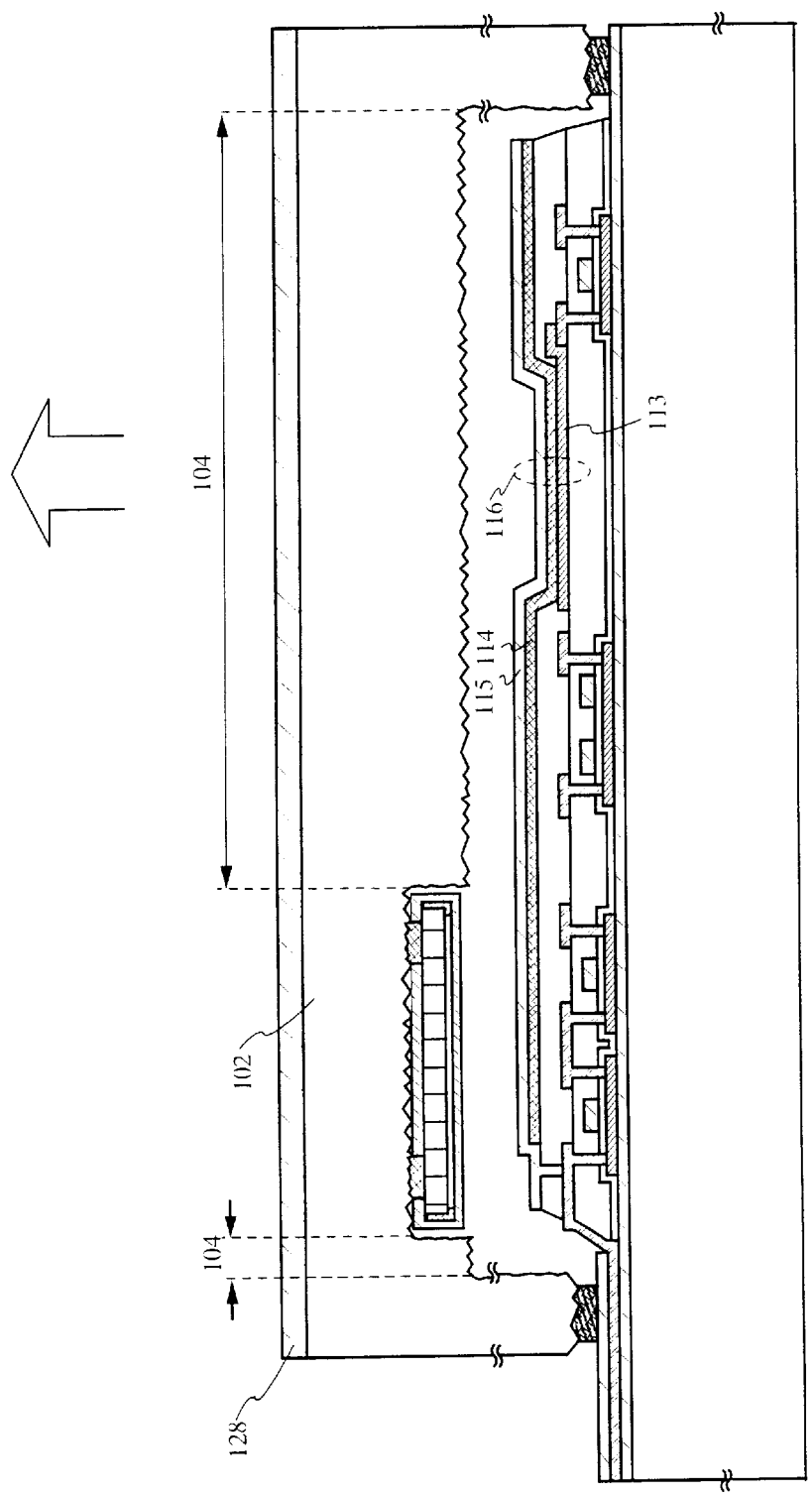
FIG. 3 is a cross sectional view of a display device using an organic light emitting element according to Embodiment Mode 3.

This embodiment mode will be described using FIG. 3. As shown in FIG. 3, in a display device in which an organic light emitting element 116 is provided, minute unevennesses are formed on the surface of a substrate onto which light emitted from the organic light emitting element is outputted. Hereinafter, this embodiment mode will be described in detail.

In this embodiment mode, the organic light emitting element 116 has a structure in which a cathode 113, an organic compound layer 114, and an anode 115 are laminated in order, and light from the organic light emitting element 116 is emitted to the side indicated by an arrow in the drawing. In other words, a user views an image from a second substrate 102 side. At this time, outside light is reflected at the interface between the second substrate 102 and a sealed space and in an interface between the second substrate and air. Thus, unwanted reflection of an ambient background view is caused. In order to prevent such a phenomenon, minute unevennesses are formed on the surface of the second substrate 102.

When the surface of the substrate is to be processed be an abrasive machining method, a first region 103, a second region 104, and a third region 105 are formed on the surface of the second substrate and then a particle size of fine powder jetted onto the surface of the substrate and a jet speed thereof is controlled to form the minute unevennesses on the surface of the first region, the second region, and the third region. The heights of the minute unevennesses are set to be 0.1 $\mu$m to 3 $\mu$m, preferably, 0.1 $\mu$m to 0.5 $\mu$m. In order to prevent diffraction, it is preferable that the unevennesses having different curvatures are provided to improve scattering property. Taking the spacing (pitch) between the convex portions as X, it is preferable to set X=0.05 to 1 $\mu$m (more preferably between 0.3 and 0.8 $\mu$m). In other words, by setting the pitch of the convex portions to be nearly equal to the wavelength of visible light, diffuse reflection (irregular reflection) of the reflected light can be made to occur effectively.

Also, in this embodiment mode, in order to prevent the reflection of outside light in an interface between the second substrate and air and the resulting occurrence of unwanted reflection of an ambient background, an anti-reflective film 128 is formed in an interface between the second substrate and air. In the case of a display device capable of performing color displays light having three colors of RGB is emitted. Thus, it is desirable that the anti-reflective film has a reflectance of 1% or lower, preferably, 0.5% or lower over a wideband (400 nm to 700 nm).

According to this embodiment mode, reflection light produced in the interface between the second substrate and the sealed space is scattered by the minute unevennesses. Together with the effect of the anti-reflective film provided on the surface of the second substrate, an ambient background of the second substrate is not reflected in the interface of the second substrate to be recognized by a user.

Embodiment

Embodiment 1

Figure 4:
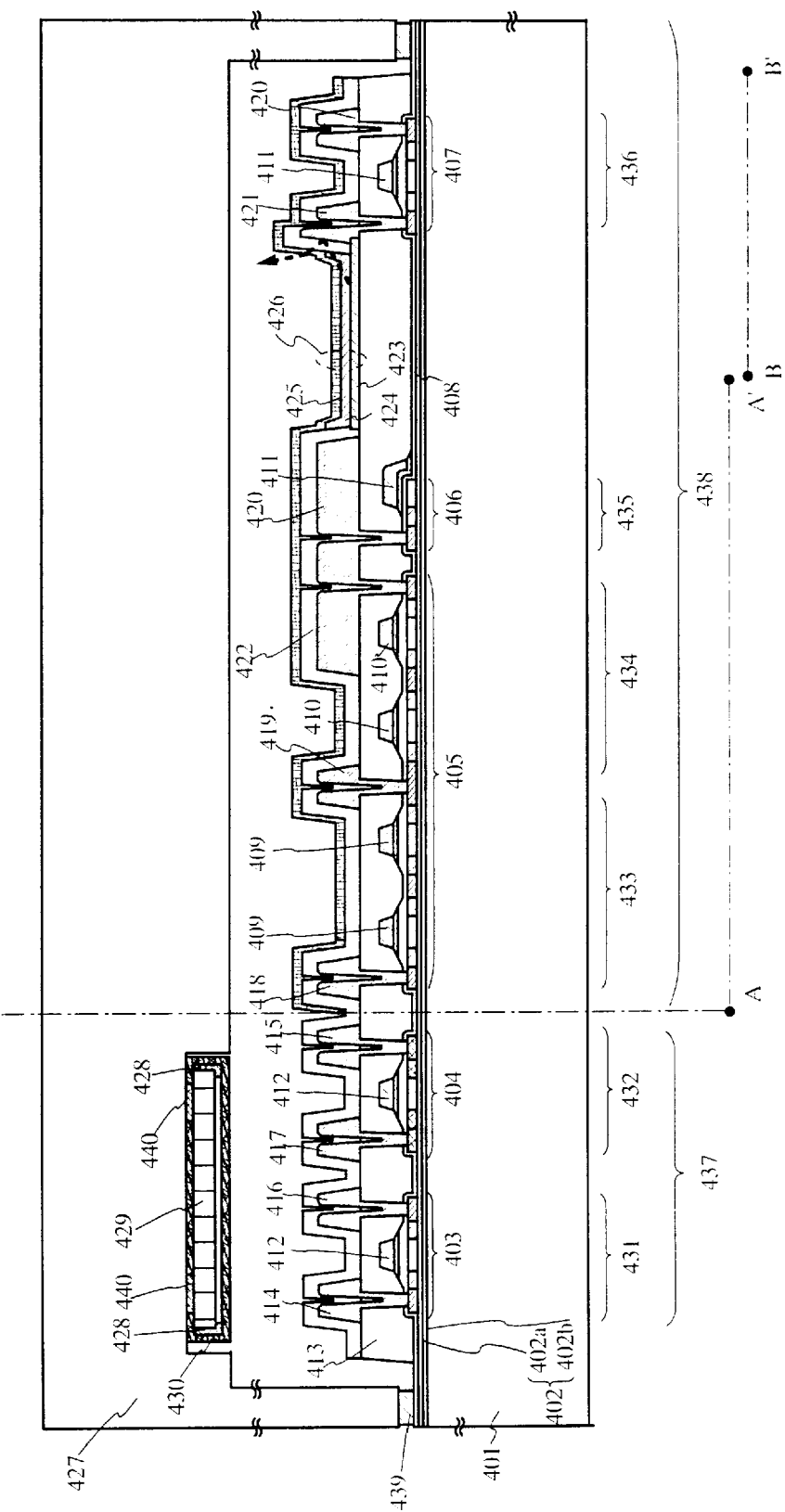
FIG. 4 is a cross sectional view of a display device using an organic light emitting element according to Embodiment 1.

The present invention can be applied to all display devices using an organic light emitting element. FIG. 4 shows one example thereof, and shows an example of an active matrix display device manufactured using TFTs. There is a case where the TFTs in this embodiment are divided into an amorphous silicon TFT and a polysilicon TFT depending on a material of a semiconductor film constituting channel forming region. However, if a field effect mobility is sufficiently high, the present invention can be applied to both TFTs.

An n-channel TFT 431 and a p-channel TFT 432 are formed in a driver circuit portion 437. A switching TFT 433, a reset TFT 434, a current control TFT 436, and a storage capacitor 435 are formed in a pixel portion 438.

As a substrate 401, a substrate made of quartz or glass such as barium borosilicate glass represented by #7059 glass, #1737 glass, and the like produced by Corning Corporation or aluminoborosilicate glass is used.

Then, a base film 402 made of an insulating film such as a silicon oxide film, a silicon nitride film, or a silicon oxynitride film is provided. For example, a silicon oxynitride film 402a made from $SiH_4$, $NH_3$, and $N_2O$ is formed at a thickness of 10 nm to 200 nm (preferably, 50 nm to 100 nm) by a plasma CVD method. Similarly, a silicon oxynitride hydride film 402b made from $SiH_4$ and $N_2O$ is formed and laminated thereon at a thickness of 50 nm to 200 nm (preferably, 100 nm to 150 nm). In this embodiment, the base film 402 has a two layers structure. However, it may also be formed as a single layer film of the insulating film mentioned above or as a lamination of two or more of these layers.

Then, island-like semiconductor layers 403 to 407, a gate insulating film 408, and gate electrodes 409 to 412 are formed. The thickness of the island-like semiconductor layers 403 to 407 is set to be 10 nm to 150 nm, the thickness of the gate insulating film is set to be 50 to 200 nm, and the thickness of the gate electrodes is set to be 50 nm to 800 nm.

Then, an interlayer insulating film 413 having a laminate structure of an insulating film made of an inorganic material such as silicon nitride or silicon oxynitride and all insulating film made of an organic material such as acrylic or polyimide is formed. The thickness of the interlayer insulating film is preferably set to be 1 μm to 3 μm. It is desirable that the insulating film made of the organic material has a thickness enough to level unevenness in height caused by the island-like semiconductor layers 403 to 407 and the gate electrodes 409 to 412.

Then, a cathode 423 of the organic light emitting element is formed. A material such as MgAg or LiF is preferably used for the cathode. The thickness of the cathode is preferably set to be 100 nm to 200 nm.

Then, a conductive film containing mainly aluminum is formed at a thickness of 1 μm to 5 μm and etched. Thus, a data wiring 418, a drain side wiring 419, a power supply wiring 420, and a drain side electrode 421 are formed in the pixel portion. The data wiring 418 is connected with the source side of the switching TFT 433. Although not shown, the drain side wiring 419 which is connected with the drain side of the switching TFT is connected with the gate electrode 411 of the current control TFT 436. The power supply wiring 420 is connected with the drain side of the current control TFT 436. The source side electrode 421 is connected with the source side of the current control TFT 436 and the cathode. In the driver circuit portion 437, wirings 414 and 416 are connected with the island-like semiconductor film 403 of the n-channel TFT 431, and wirings 415 and 417 are connected with the island-like semiconductor film 404 of the p-channel TFT 432. Note that, in this embodiment, a condition for etching the conductive film containing mainly aluminum is controlled to provide tapers having an angle of 15° to 70° relative to the surface (upper surface) of the interlayer insulating film are provided in side surfaces of these wirings. Light emitted from the organic light emitting element in random directions is reflected by these side surfaces of the wirings to thereby prevent total reflection.

Then, a bank 422 made of an insulating material is formed so as to cover these wirings. The bank 422 is formed so as to cover end portions of the cathode 423 so that a short circuit between the anode and the cathode in this region is prevented. In this embodiment, a bank made of an inorganic material such as silicon oxide or silicon oxynitride is formed at a thickness of 1 μm to 3 μm. The inorganic insulating film is formed in parallel to taper surfaces of the drain side electrode 421 and the like. Thus, the travelling direction of reflection light is easily estimated based on Snell's law.

Then, an organic compound layer 424 of the organic light emitting element is formed. The organic compound layer is used with a single layer or a laminate structure. However, when the laminate structure is used, higher light emission efficiency is obtained. Generally, a hole injection layer, a hole transport layer, a light emitting layer, and an electron transport layer are formed in this order on the anode. However, the organic compound layer may also has a structure such that a hole transport layer, a light emitting layer, and an electron transport layer are formed in this order or a structure such that a hole injection layer, a hole transport layer, a light emitting layer, an electron transport layer, and an electron injection layer are formed in the stated order. In the present invention, any known structure may be used.

Note that in this embodiment, color display is performed by a method of vapor-depositing three kinds of light emitting layers corresponding to RGB. As regards specific light emitting layers, preferably, cyanopolyphenylene is used for a light emitting layer for emitting light having a red color, polyphenylenevinylene is used for a light emitting layer for emitting light having a green color, and polyphenylenevinylene or polyalkylphenylene is used for a light emitting layer for emitting light having a blue color. The thickness of the light emitting layers is preferably 30 nm to 150 nm. The above example is only one example of materials which can be used for a light emitting layer, and the materials are not limited to these.

Note that the organic compound layer indicated in this embodiment has a laminate structure of a light emitting layer and a hole injection layer made of PEDOT (polyethylene dioxythiophene) or PAni (polyaniline).

Then, an anode 425 made of ITO (indium tin oxide) is formed. Thus, the organic light emitting element which is composed of the cathode made of a material such as MAgAg or LiF, the organic compound layer in which the light emitting layer and the hole transport layer are laminated, and the anode made of ITO (indium tin oxide) is provided. Note that, when a transparent electrode is used as the anode, light can be emitted to a sealing substrate (second substrate) 427 side in FIG. 4.

The outer edge portion of the sealing substrate 427 is convex to the first substrate. By this convex portion, a gap between the organic light emitting element provided in the first substrate and the second substrate in the pixel portion 438 is controlled. Since the gap is determined by means of the convex outer edge portion of the sealing substrate, the thickness of a layer 439 having adhesion, which is provided between the sealing substrate and the element substrate can be minimized. In this embodiment, the thickness of the layer having adhesion is set to be 1.0 μm.

Substrates made of glass are used for the sealing substrate and the element substrate on which the organic light emitting element 426 is provided. Note that, in this embodiment, the surface of the sealing substrate is processed to provide a dry agent 429 within a sealed region. Thus, similar to the case where a metallic substrate is used as the sealing substrate, moisture present in the sealed region can be absorbed by the dry agent. The dry agent 429 is covered by a porous film 430. The porous film is adhered to the dry agent by an adhesive 428. Also, the porous film is cut out in a circle, and an adhesive 440 is applied to the thus exposed portion of the dry agent to thereby bond the dry agent onto the sealing substrate 427.

Figure 5:
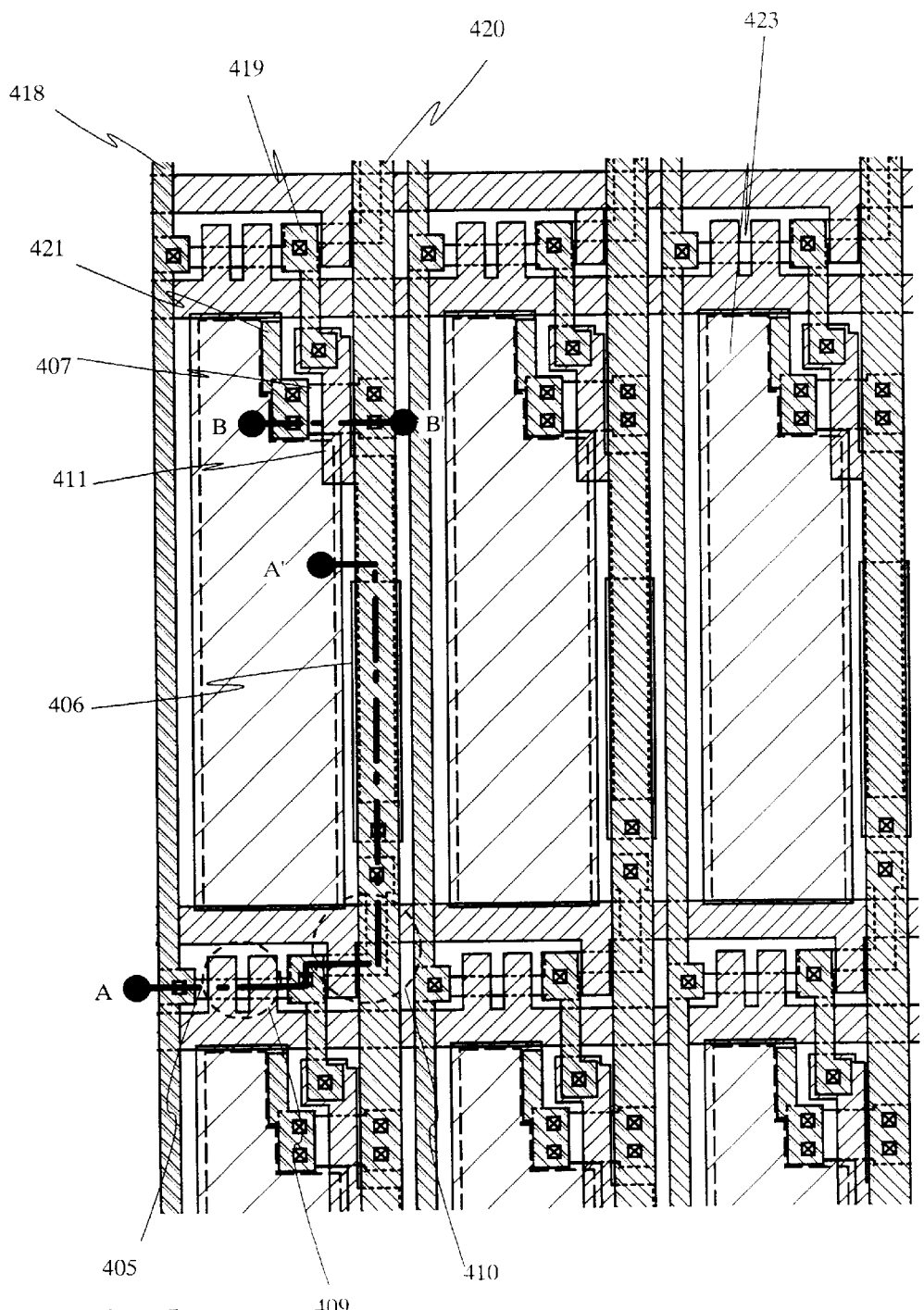
FIG. 5 is a top view for explaining a structure of a pixel portion of the display device using the organic light emitting element according to Embodiment 1.

FIG. 5 is a top view of the pixel portion shown in FIG. 4 and reference numerals common to those in FIG. 4 are used for convenience of description. Note that, cross sections taken along lines A–A' and B–B' in FIG. 5 are shown in FIG. 4. Further, the bank is provided outside the regions surrounded by chain lines. Also, the light emitting layers corresponding to RGB are provided inside the regions surrounded by the chain lines.

Figure 6:
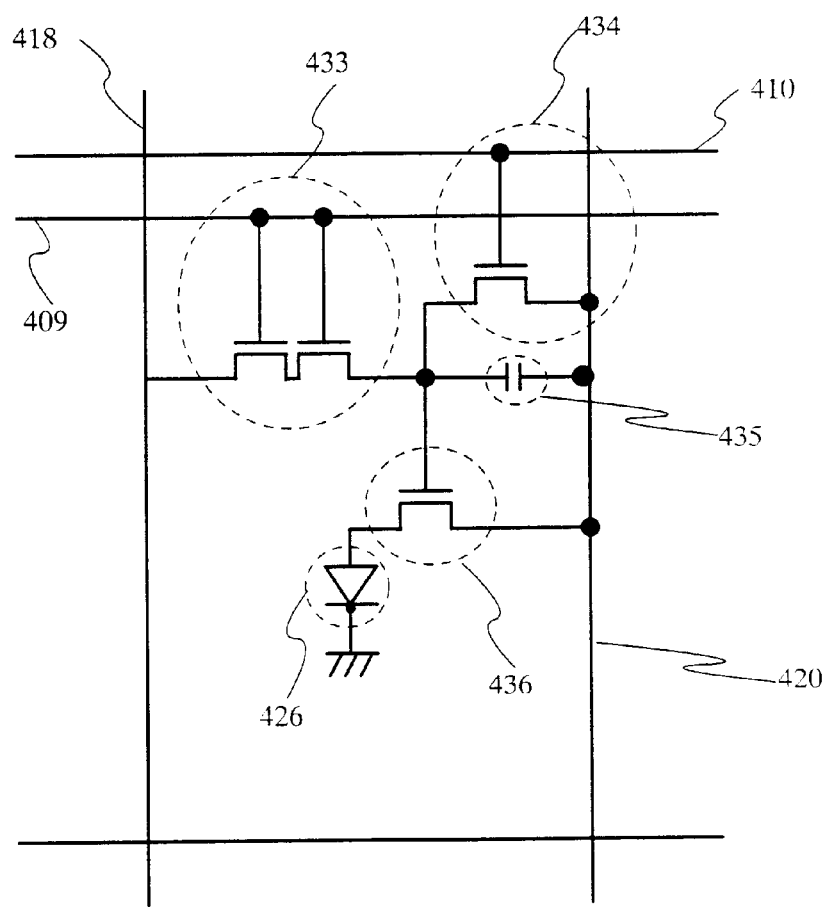
FIG. 6 shows an equivalent circuit of the pixel portion of the display device using the organic light emitting element according to Embodiment 1.

FIG. 6 shows an equivalent circuit of such a pixel portion and reference numerals common to those in FIG. 4 are used for convenience. The switching TFT 433 has a multi gate structure. LDDs overlapped with the gate electrode are provided in the current control TFT 436. Since a TFT using polysilicon has a high operation speed, deterioration phenomenon such as a hot carrier injection is easy to occur. Thus, for manufacture of a display device having high reliability and capable of excellent image display (having high operation performance), it is very effective to form TFTs having different structures (switching TFT in which an off current is sufficiently low and current control TFT which is resistant to a hot carrier injection) in the pixel in accordance with a function.

Also, it is effective to provide a storage capacitor (condenser) 435 to hold the current control TFT 436 in an on state even after the switching TFT 433 is changed from an on state to an off state, to thereby continue light emission by the organic light emitting element and obtain display at high luminance.

Further, in the case of a time divisional gradation system for performing gradation display by changing a time interval of light emission of the organic light emitting element, it is preferable that the reset TFT 434 is set to be an on state to change the organic light emitting element from a light emission state to a non-light emission state to thereby control a time interval of light emission of the organic light emitting element.

When the dry agent is provided near the organic light emitting element in such a display device using the organic light emitting element, the deterioration of the organic light emitting element can be prevented and the stability of the display device can be ensured over a long period of time. Also, since the gap can be controlled by using the sealing substrate, the thickness of the layer having adhesion, which is provided between the sealing substrate and the element substrate, can be minimized. Thus, the area of the layer having adhesion to be exposed to outside air is decreased and thus the amount of water vapor transmitted through the layer having adhesion can be reduced.

Embodiment 2

In this embodiment, when mother substrates (mother glass) each having an area equivalent to combined areas of a large number of unit panels are bonded to each other and then respective panels are to be severed therefrom, a $CO_2$ laser is used as the severing means.

The $CO_2$ laser is a laser using carbon dioxide as a reactive medium and operated in a population inversion state by causing carbon oxide to be in an excitation state. Since light having a wavelength of an infrared region (10.6 nm) is generated by oscillation, an object to be irradiated with laser light can be heated.

Figure 9:
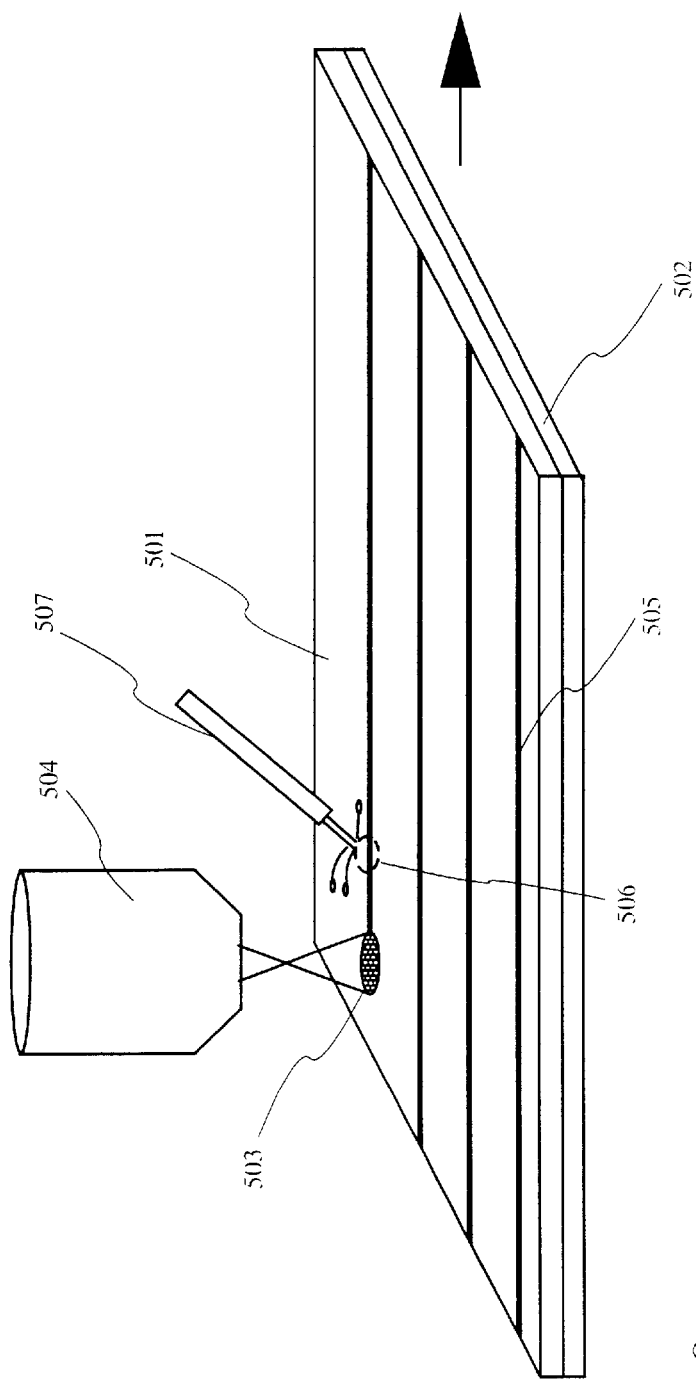
FIG. 9 is a perspective view indicating a method of cutting a glass substrate using a $CO_2$ laser.

A method of cutting a glass substrate by using a $CO_2$ laser will be described using a perspective view of FIG. 9. FIG. 9 is a perspective view indicating a method of cutting one of glass substrates 501 and 502 which are bonded together. An elliptic laser beam spot is irradiated by an optical system 504 for irradiating laser to the glass substrate 501 moving in a direction indicated by an arrow and a coolant is blasted by a nozzle 507 onto a region (cooling region 506) behind the beam spot 503. Thus, when the region heated by laser irradiation is rapidly cooled, thermal distortion is caused within the glass substrate so that the glass substrate 501 is severed along laser irradiation lines 505.

A laser scriber produced by Mitsuboshi Diamond Industrial Co., Ltd can be used as an apparatus for cutting the glass substrate using the $CO_2$ laser. Two mother substrates (mother glass) may be simultaneously cut or may be cut one by one. It is preferable that two substrates are simultaneously cut. This is because tact of the step is improved and thus productivity is increased.

When laser light from the $CO_2$ laser is irradiated to the surface of the glass substrate to cut it, generation of cutting scraps of the glass substrate is suppressed and a resulting operational failure can be prevented. In the method of cutting the substrate using the $CO_2$ laser, both laser irradiation and coolant blasting are performed in combination so that a shock to the substrate is made small. Thus, when the shock resistance of the substrate is reduced due to the reduced thickness of the display device, the method of cutting the glass substrate using the $CO_2$ laser is effective.

Embodiment 3

The light emitting device manufactured by implementing the present invention is incorporated in various electronic appliances and the pixel portion is used as an image display unit. As an electronic appliance of the present invention, there are a mobile telephone, a PDA, an electronic book device, a video camera, a notebook personal computer, an image reproduction apparatus provided with a recording medium such as a DVD (digital versatile disc) player or a digital camera. Specific examples of these electronic devices are shown in FIGS. 10A to 10D and FIGS. 11A to 11C.

Figure 10A:
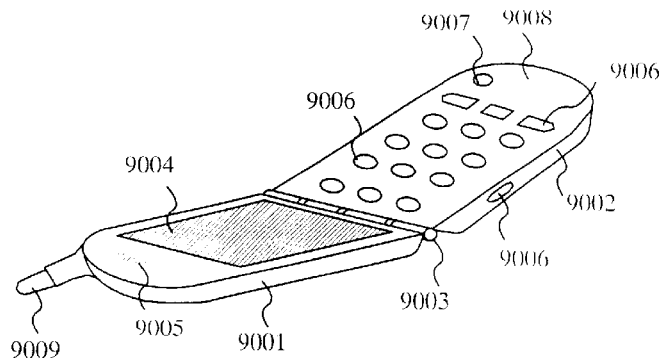
FIGS. 10A to 10D are explanatory views of examples of electronic appliances.

FIG. 10A shows a mobile telephone which is composed of a display panel 9001, an operation panel 9002, and a connection portion 9003. A display device 9004, a voice output unit 9005, an antenna 9009 and the like are provided in the display panel 9001. Operation keys 9006, a power source switch 9007, a voice input unit 9008, and the like are provided in the operational panel 9002. The present invention can be applied to the display device 9004.

Figure 10B:
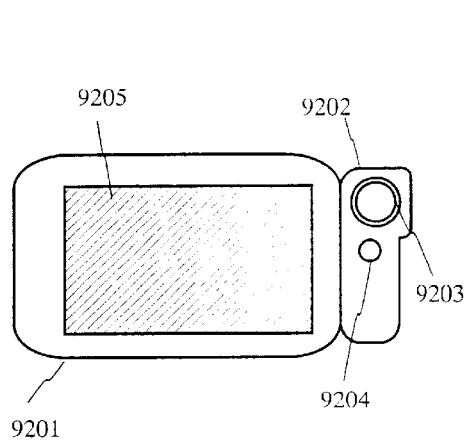

FIG. 10B shows a mobile computer or a personal digital assistant, which is composed of a main body 9201, a camera unit 9202, an image receiving unit 9203, an operational switch 9204, and a display device 9205. The present invention can be applied to the display device 9205. A display device of 3-inch to 5-inch size is used as such an electronic appliance. When the display device of the present invention is used, the weight of such a personal digital assistant can be reduced.

Figure 10C:
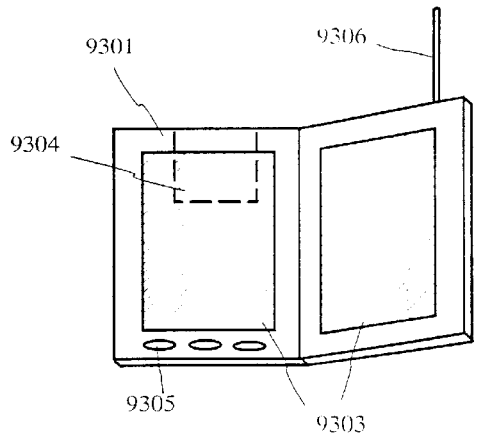

FIG. 10C shows an electronic book device which is composed of a main body 9301, a display device 9303, a recording medium 9304, an operational switch 9305, and an antenna 9306. This electronic book device is used for displaying data stored in a mini disk (MD) or a DVD and data received by the antenna. The present invention is can be applied to the display device 9303. A display device of 4-inch to 12-inch size is used as the electronic book device. When the display device of the present invention is used, reduction in weight and thickness of such an electronic book device can be realized.

Figure 10D:
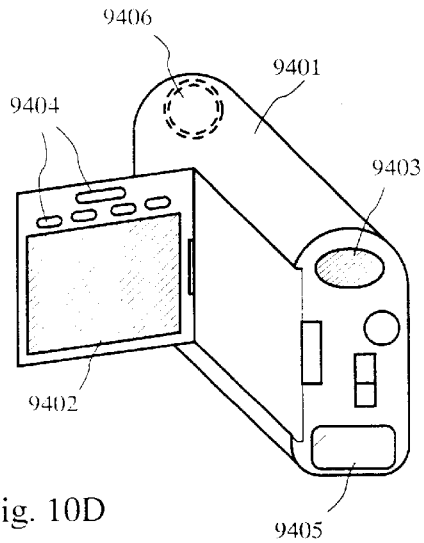

FIG. 10D shows a video camera which is composed of a main body 9401, a display device 9402, a voice input unit 9403, an operation switch 9404, a battery 9405, and the like. The present invention can be applied to the display device 9402.

Figure 11A:
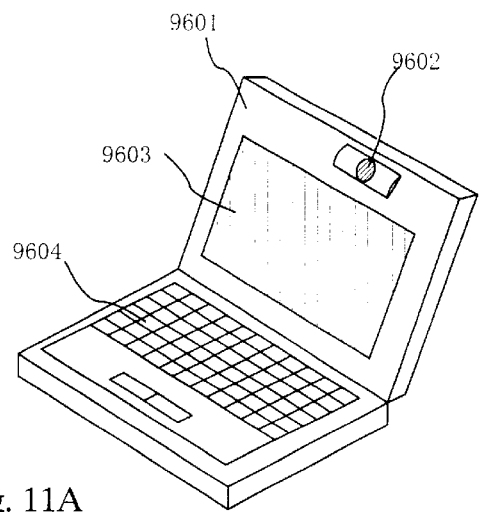
FIGS. 11A to 11C are explanatory views of examples of electronic appliances.

FIG. 11A shows a personal computer which is composed of a main body 9601, an image input unit 9602, a display device 9603, and a keyboard 9604. The present invention is can be applied to the display device 9603.

Figure 11B:
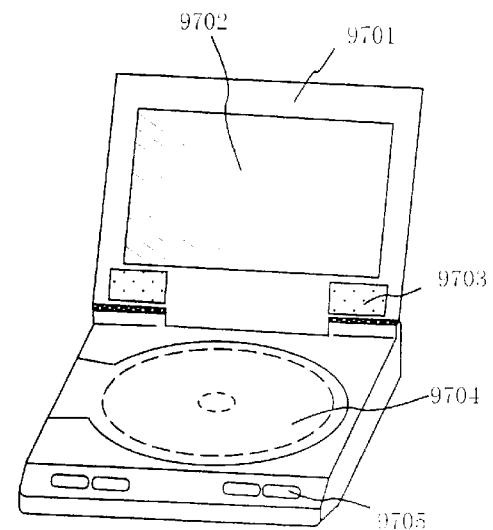
Figure 11C:
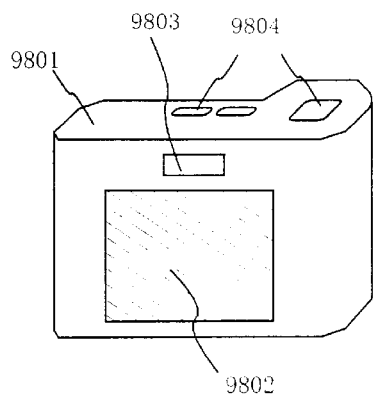

FIG. 11B shows a player using a recording medium in which a program is recorded (hereinafter referred to as a recording medium), which is composed of a main body 9701, a display device 9702, a speaker unit 9703, a recording medium 9704, and an operational switch 9705. Note that, with this player, a DVD (digital versatile disc), a CD or the like is used as the recording medium to play music, watch movies, play video games or use the Internet. The present invention can be applied to the display device 9702.

Also, in the operation of the mobile telephone shown in FIG. 10A, when display brightness is increased while using the operation keys and then the brightness is lowered after the use of the operation keys is finished, whereby power consumption can be reduced. Further, power consumption can be also reduced by increasing the display brightness upon receiving an incoming call and then lowering it during a telephone conversation. Furthermore, power consumption can be also reduced by proving a function such that display is turned off based on time control unless reset operation is performed during continuous use of the telephone. Note that these operations may be made by manual control.

Although not shown here, the present invention can be also applied to a display device incorporated in a navigation system, a refrigerator, a washer a microwave oven, a fixed telephone, a facsimile, or the like. Thus, an application range of the present invention is extremely wide so that the present invention can be applied to various products.

As described above, when the present invention is used, the gap can be controlled by the convex portion of the sealing substrate and the thickness of the layer having adhesion provided between the sealing substrate and the element substrate can be minimized. Thus, the area of the organic resin material (having adhesion) exposed to outside air in the side surfaces of the display device is decreased. Accordingly, the amount of moisture which is transmitted through the organic resin material and penetrated in the sealed region, which is obtained as the product of the area to be exposed to outside air and moisture permeability can be reduced.

Conventionally, in order to provide a dry agent in the sealed region, it is necessary to bond a metallic sealing substrate and a glass substrate together. Thus, when the shock resistance of the glass substrate is reduced due to its reduced thickness, because of a difference in thermal expansion coefficient between metal and glass, there is a possibility that a distortion is caused by rapid thermal change and the glass substrate is damaged as a result. However, according to the present invention, the sealing substrate and the element substrate can be made of the same material so that the resistance to a thermal shock is improved. Also, since the surface of the glass substrate is processed and the dry agent is provided, as in the conventional art, moisture is absorbed by the dry agent. Thus, reduction in light emission intensity due to moisture, occurrence of a dark spot, reduction of a light emission area due to enlarged dark spot, and deterioration of the element can be suppressed.

What is claimed is:

1. A display device comprising:

a first substrate;

an organic light emitting element over the first substrate; and a second substrate which is translucent, the second substrate bonded to the first substrate through a layer having adhesion, wherein a surface of the second substrate opposing the first substrate comprises a first thickness at a first region and a second thickness at a second region, the first region is adhered with the layer having adhesion, and the second region is located inside the first region and concaved relative to the first region.

2. A display device according to claim 1, wherein the first substrate is a glass substrate.

3. A display device according to claim 1, wherein the first substrate and the second substrate are a glass substrate.

4. A display device according to claim 1, wherein a thickness of the layer having adhesion is 10 $\mu$m or less.

5. A display device according to claim 1, wherein the display device is an active matrix display device.

6. A display device according to claim 1, wherein the display device is a passive matrix display device.

7. A display device comprising;

a first substrate;

an organic light emitting element over the first substrate; and a second substrate which is translucent, the second substrate bonded to the first substrate through a layer having adhesion, wherein a surface of the second substrate opposing the first substrate comprises a first region, a second region, and a third region, the first region is adhered with the layer having adhesion, the second region is located inside the first region and concaved relative to the first region, the third region is located inside the second region and concaved relative to the second region, and wherein a dry agent is provided in the third region.

8. A display device according to claim 7, wherein a permeable film is adhered to a portion of the second region to thereby contain the dry agent in the third region.

9. A display device according to claim 8, wherein the permeable film is provided so that a bottom surface of the permeable film is not contact with the first substrate.

10. A display device according to claim 8, wherein a difference in height between a bottom portion of the second region which is concaved relative to the first region and the first region is 160 µm to 350 µm.

11. A display device according to claim 7, wherein a difference in height between a bottom portion of the second region which is concaved relative to the first region and the first region is 10 µm to 50 µm.

12. A display device according to claim 7, wherein a difference in heioht between a bottom portion of the third region which is concaved relative to the second region and the second region is 50 µm to 150 µm.

13. A display device according to claim 7, wherein the first substrate is a glass substrate.

14. A display device according to claim 7, wherein the first substrate and the second substrate are a glass substrate.

15. A display device according to claim 7, wherein a thickness of the layer having adhesion is 10 µm or less.

16. A display device according to claim 7, wherein the display device is an active matrix display device.

17. A display device according to claim 7, wherein the display device is a passive matrix display device.

18. A display device comprising:
a first substrate;
an organic light emitting element over the first substrate:
a layer having adhesion for enclosing with a gap an area surrounding a region in which the organic light emitting element is provided on the first substrate; and
a second substrate which is translucent, the second substrate bonded to the first substrate through the layer having adhesion,
wherein a surface of the second substrate opposing the first substrate comprises a first region, a second region, and a third region, the first region is adhered with the layer having adhesion, the second region is surrounded by the first region and concaved relative to the first region, the third region is located between the layer having adhesion and an upper portion of the region in which the organic light emitting element is provided and concaved relative to the second region, and
wherein a dry agent is located in the third region.

19. A display device according to claim 18, wherein a permeable film is provided between the layer having adhesion and the upper portion of the region in which the organic light emitting element is provided, and the permeable film is adhered to a part of the second region to thereby contain the agent in the third region.

20. A display device according to claim 19, wherein the permeable film is provided so that a bottom surface of the permeable film is not contact with the first substrate.

21. A display device according to claim 19, wherein a difference in height between a bottom portion of the second region which is concaved relative to the first region and the first region is 160 µm to 350 µm.

22. A display device according to claim 18, wherein a difference in height between a bottom portion of the second region which is concaved relative to the first region and the first region is 10 µm to 50 µm.

23. A display device according to claim 18, wherein a difference in height between a bottom portion of the third region which is concaved relative to the second region and the second region is 50 µm to 150 µm.

24. A display device according to claim 18, wherein the first substrate is a glass substrate.

25. A display device according to claim 18, wherein the first substrate and the second substrate are a glass substrate.

26. A display device according to claim 18, wherein a thickness of the layer having adhesion is 10 µm or less.

27. A display device according to claim 18, wherein the display device is an active matrix display device.

28. A display device according to claim 18, wherein the display device is a passive matrix display device.

29. A passive matrix display device comprising:
a first substrate;
an organic light emitting element over the first substrate: and
a second substrate which is translucent, the second substrate is bonded to the first substrate through a layer having adhesion,
wherein minute unevennesses are formed on a surface of the second substrate.

30. A passive matrix display device according to claim 29, wherein height of the minute unevennesses are set to be 0.1 µm to 3 µm.

31. A display device according to claim 29, wherein the first substrate is a glass substrate.

32. A display device according to claim 29, wherein the first substrate and the second substrate are a glass substrate.

33. A display device according to claim 29, wherein a thickness of the layer having adhesion is 10 µm or less.

34. An active matrix display device comprising:
a first substrate;
at least one thin film transistor over the first substrate;
an insulating film over the thin film transistor;
an organic light emitting element over the insulating film: and
a second substrate which is translucent, the second substrate bonded to the first substrate through a layer having adhesion,
wherein minute unevennesses are formed on a surface of the second substrate.

35. A passive matrix display device according to claim 34, wherein height of the minute unevennesses are set to be 0.1 µm to 3 µm.

36. A display device according to claim 34, wherein the first substrate is a glass substrate.

37. A display device according to claim 34, wherein the first substrate and the second substrate are a glass substrate.

38. A display device according to claim 34, wherein a thickness of the layer having adhesion is 10 µm or less.

39. A method of manufacturing a display device in which a first substrate on which an organic light emitting element is provided and a second substrate bonded to the first substrate through a layer having adhesion, the method comprising:
providing a first mask in at least a first region to which the layer having adhesion is adhered;
first digging the second substrate by an abrasive machining method to form a second region which is concaved relative to the first region;
removing the first mask;
providing a second mask at least in a region where the first mask is provided and in a region located above a region where the organic light emitting element is provided:
second digging the second substrate by an abrasive machining method to thereby form a third region which is concaved relative to the second region; and
providing a dry agent in the third region.

40. A method of manufacturing a display device according to claim 39, further comprising a step of providing a permeable film in the second and the third region after the providing a dry agent in the third region.

41. A method of manufacturing a display device according to claim 40, wherein a first digging depth is larger than a thickness of the permeable film.

42. A method of manufacturing a display device according to claim 41, wherein the first digging depth is 160 μm to 350 μm.

43. A method of manufacturing a display device according to claim 40, further comprising after the providing the permeable film:
   bonding the first substrate and the second substrate together through the layer having adhesion; and
   cutting the first substrate and the second substrate by a gas laser.

44. A method of manufacturing a display device according to claim 43, wherein the gas laser is a $CO_2$ laser.

45. A method of manufacturing a display device according to claim 39, wherein a first digging depth is 10 μm to 50 μm.

46. A method of manufacturing a display device according to claim 39, wherein a second digging depth is 50 μm to 150 μm.

47. A method of manufacturing a display device according to claim 39, further comprising:
   bonding the first substrate and the second substrate together through the layer having adhesion after the providing a dry agent in the third region: and
   cutting the first substrate and the second substrate by a gas laser.

48. A method of manufacturing a display device according to claim 47, wherein the gas laser is a $CO_2$ laser.

* * * * *